(12) United States Patent
Hasebe et al.

(10) Patent No.: US 9,496,204 B2
(45) Date of Patent: Nov. 15, 2016

(54) SEMICONDUCTOR DEVICE

(71) Applicants: RENESAS ELECTRONICS CORPORATION, Kawasaki-shi, Kanagawa (JP); HITACHI HOKKAI SEMICONDUCTOR LTD., Kameda-gun, Hokkaido (JP)

(72) Inventors: Hajime Hasebe, Hakodate (JP); Tadatoshi Danno, Takasaki (JP); Yukihiro Satou, Takasaki (JP)

(73) Assignees: RENESAS ELECTRONICS CORPORATION, Tokyo (JP); RENESAS SEMICONDUCTOR PACKAGE & TEST SOLUTIONS CO., LTD., Gunma (JP)

(*) Notice: Subject to any disclaimer, the term of this patent is extended or adjusted under 35 U.S.C. 154(b) by 0 days.

(21) Appl. No.: 14/090,295

(22) Filed: Nov. 26, 2013

(65) Prior Publication Data
US 2014/0084440 A1 Mar. 27, 2014

Related U.S. Application Data

(63) Continuation of application No. 13/240,132, filed on Sep. 22, 2011, now Pat. No. 8,618,642, which is a continuation of application No. 12/982,432, filed on Dec. 30, 2010, now Pat. No. 8,044,509, which is a
(Continued)

(30) Foreign Application Priority Data

Dec. 28, 2000 (JP) .................................. 2000-401933
Sep. 28, 2001 (JP) .................................. 2001-301355

(51) Int. Cl.
*H01L 23/49* (2006.01)
*H01L 23/31* (2006.01)
(Continued)

(52) U.S. Cl.
CPC ........... *H01L 23/49* (2013.01); *H01L 23/3107* (2013.01); *H01L 23/49503* (2013.01);
(Continued)

(58) Field of Classification Search
CPC .......... H01L 2224/48247; H01L 2224/45144; H01L 24/48; H01L 24/49; H01L 23/3107; H01L 24/97; H01L 23/49; H01L 23/49548; H01L 24/32; H01L 24/45; H01L 24/73; H01L 24/29; H01L 2224/48253; H01L 2224/48599; H01L 2224/83385; H01L 2224/27013; H01L 2924/181; H01L 2924/351; H01L 2924/15151
USPC ........................................................ 257/690
See application file for complete search history.

(56) References Cited

U.S. PATENT DOCUMENTS 5,237,202 A  8/1993  Shimizu et al.
6,025,640 A  2/2000  Yagi et al.
(Continued)

FOREIGN PATENT DOCUMENTS

JP  02-292850 A  12/1990
JP  3-69248 U  7/1991
(Continued)

OTHER PUBLICATIONS

"Assembly Process Issues and Reliability in Microsystem Packaging", Proceedings of SPIE, vol. 5343.*
(Continued)

*Primary Examiner* — Bilkis Jahan
*Assistant Examiner* — Nga Doan
(74) *Attorney, Agent, or Firm* — Mattingly & Malur, PC

(57) ABSTRACT

In a non-leaded type semiconductor device, a tab, tab suspension leads, and other leads are exposed to one surface of a seal member. A semiconductor element is positioned within the seal member and fixed to a surface of the tab with an adhesive. The tab is formed larger than the semiconductor element so that outer peripheral edges of the tab are positioned outside outer peripheral edges of the semiconductor element. A groove is formed in the tab surface portion positioned between the area to which the semiconductor element is fixed and wire connection areas to which the wires are connected, the groove being formed so as to surround the semiconductor element fixing area, thereby preventing peeling-off between the tab to which the semiconductor element is fixed and the resin which constitutes the package.

34 Claims, 12 Drawing Sheets

Related U.S. Application Data continuation of application No. 12/410,946, filed on Mar. 25, 2009, now Pat. No. 7,911,054, which is a continuation of application No. 10/664,978, filed on Sep. 22, 2003, now Pat. No. 7,518,156, which is a continuation of application No. 09/988,644, filed on Nov. 20, 2001, now Pat. No. 6,713,849.

(51) Int. Cl.
*H01L 23/495* (2006.01)
*H01L 23/00* (2006.01)

(52) U.S. Cl.
CPC ......... *H01L23/49548* (2013.01); *H01L 24/32* (2013.01); *H01L 24/48* (2013.01); *H01L 24/49* (2013.01); *H01L 24/97* (2013.01); *H01L 24/29* (2013.01); *H01L 24/45* (2013.01); *H01L 24/73* (2013.01); *H01L 2224/26175* (2013.01); *H01L 2224/27013* (2013.01); *H01L 2224/29339* (2013.01); *H01L 2224/32057* (2013.01); *H01L 2224/32245* (2013.01); *H01L 2224/32257* (2013.01); *H01L 2224/45144* (2013.01); *H01L 2224/484* (2013.01); *H01L 2224/48091* (2013.01); *H01L 2224/48095* (2013.01); *H01L 2224/48247* (2013.01); *H01L 2224/48253* (2013.01); *H01L 2224/48257* (2013.01); *H01L 2224/48463* (2013.01); *H01L 2224/48599* (2013.01); *H01L 2224/48639* (2013.01); *H01L 2224/49171* (2013.01); *H01L 2224/73265* (2013.01); *H01L 2224/83051* (2013.01); *H01L 2224/83101* (2013.01); *H01L 2224/83385* (2013.01); *H01L 2224/85439* (2013.01); *H01L 2224/92* (2013.01); *H01L 2224/92247* (2013.01); *H01L 2224/97* (2013.01); *H01L 2924/014* (2013.01); *H01L 2924/01004* (2013.01); *H01L 2924/01005* (2013.01); *H01L 2924/01006* (2013.01); *H01L 2924/01014* (2013.01); *H01L 2924/01015* (2013.01); *H01L 2924/01023* (2013.01); *H01L 2924/01029* (2013.01); *H01L 2924/01033* (2013.01); *H01L 2924/01039* (2013.01); *H01L 2924/01047* (2013.01); *H01L 2924/01067* (2013.01); *H01L 2924/01078* (2013.01); *H01L 2924/01079* (2013.01); *H01L 2924/01082* (2013.01); *H01L 2924/01087* (2013.01); *H01L 2924/15151* (2013.01); *H01L 2924/15747* (2013.01); *H01L 2924/181* (2013.01); *H01L 2924/351* (2013.01); *Y10T 29/49121* (2015.01)

(56) References Cited

U.S. PATENT DOCUMENTS

| | | | |
|---|---|---|---|
| 6,054,716 A | 4/2000 | Sonobe et al. | |
| 6,081,029 A * | 6/2000 | Yamaguchi | 257/718 |
| 6,166,430 A | 12/2000 | Yamaguchi | |
| 6,208,020 B1 | 3/2001 | Minamio et al. | |
| 6,310,364 B1 | 10/2001 | Uemura | |
| 6,388,311 B1 | 5/2002 | Nakashima et al. | |
| 6,437,427 B1 | 8/2002 | Choi | |
| 6,451,627 B1 * | 9/2002 | Coffman | 438/111 |
| 6,580,159 B1 * | 6/2003 | Fusaro | H01L 23/3121 257/668 |
| 6,696,704 B1 | 2/2004 | Maeda et al. | |
| 6,713,849 B2 | 3/2004 | Hasebe et al. | |
| 6,853,059 B1 | 2/2005 | Jang | |
| 7,095,100 B2 | 8/2006 | Kasuya | |
| 7,171,744 B2 | 2/2007 | Takahashi | |
| 2002/0027297 A1 | 3/2002 | Ikenaga et al. | |
| 2003/0006055 A1 * | 1/2003 | Chien-Hung | H01L 23/3107 174/534 |
| 2004/0212051 A1 * | 10/2004 | Zhao et al. | 257/672 |

FOREIGN PATENT DOCUMENTS

| | | |
|---|---|---|
| JP | 03-218658 A | 9/1991 |
| JP | 5-152733 A | 6/1993 |
| JP | 06-85132 | 3/1994 |
| JP | 06-252328 A | 9/1994 |
| JP | 06-302754 A | 10/1994 |
| JP | 06-338583 | 12/1994 |
| JP | 10-229273 A | 8/1998 |
| JP | 10-247701 A | 9/1998 |
| JP | 11-251494 | 9/1999 |
| JP | 11-260985 A | 9/1999 |
| JP | 11-340409 A | 12/1999 |
| JP | 11-345897 | 12/1999 |
| JP | 2000-3981 A | 1/2000 |
| JP | 2000-091489 A | 3/2000 |
| JP | 2000-196006 | 7/2000 |
| JP | 2000-252403 A | 9/2000 |
| JP | 2000-307049 A | 11/2000 |
| JP | 2000-340732 A | 12/2000 |
| JP | 2002-261187 A | 9/2002 |
| JP | 4-30494 A | 7/2016 |
| WO | 99/00826 | 1/1999 |

OTHER PUBLICATIONS

"Popcorning: A Failure Mechanism in Plastic-Encapsulated Microcircuits", IEEE transactions on reliability, vol. 44, No. 3, Sep. 1995.*

Japanese Office Action received in corresponding Japanese Application No. 2012-127848 dated Aug. 21, 2014.

Japanese Office Action received in corresponding Japanese Application No. 2014-108023 dated Aug. 20, 2015.

Japanese Office Action received in Japanese Application No. 2013-110877 dated Apr. 3, 2014.

Japanese Office Action received in corresponding Japanese Application No. 2015-201743 dated Jul. 7, 2016.

* cited by examiner

SEMICONDUCTOR DEVICE

This application is a continuation of U.S. patent application Ser. No. 13/240,132, filed Sep. 22, 2011, which is a continuation of U.S. patent application Ser. No. 12/982,432, filed Dec. 30, 2010, now U.S. Pat. No. 8,044,509, which is a continuation of U.S. patent application Ser. No. 12/410,946, filed Mar. 25, 2009, now U.S. Pat. No. 7,911,054, which is a continuation of U.S. patent application Ser. No. 10/664,978, filed Sep. 22, 2003, now U.S. Pat. No. 7,518,156, which is a continuation of U.S. patent application Ser. No. 09/988,644, filed Nov. 20, 2001, now U.S. Pat. No. 6,713,849, the contents of which are hereby incorporated by reference into this application.

BACKGROUND OF THE INVENTION

The present invention relates to a technique for manufacturing a resin-sealed type semiconductor device using a lead frame and more particularly to a technique effective in its application to the manufacture of a semiconductor device (a non-leaded type semiconductor device) in which external electrode terminals are exposed to mounting side faces without intentional projection sideways of a package, such as SON (Small Outline Non-Leaded Package) and QFN (Quad Flat Non-Leaded Package).

In the manufacture of a resin-sealed type semiconductor device there is used a lead frame. The lead frame is fabricated by forming a metallic plate into a desired pattern by blanking with a precision press or by etching. The lead frame has a tab for fixing a semiconductor element (semiconductor chip), a support portion called die pad, and plural leads whose front ends (inner ends) face an outer periphery of the support portion. The tab is supported by tab suspension leads extending from a frame portion of the lead frame.

In manufacturing a resin-sealed semiconductor device with use of such a lead frame, a semiconductor chip is fixed to the tab of the lead frame, electrodes on the semiconductor chip and the front ends, or the inner ends, of the leads are connected together using conductive wires, then the inner end sides of the leads, including the wires and the semiconductor chip, are sealed with an insulating resin to form a seal member (package), thereafter, an unnecessary lead frame portion is cut off and at the same time lead portions and tab suspension lead portions projecting from the package are cut off.

On the other hand, as one of resin-sealed type semiconductor devices manufactured using a lead frame there is known a semiconductor device (non-leaded type semiconductor device) wherein a package is formed by one-side molding on one side of a lead frame and leads as external electrode terminals are exposed to one side of the package, without intentional projection of the leads from a peripheral surface of the package. As this type of semiconductor devices there are known an SON wherein leads are exposed to both side edges of one surface of a package and a QFN wherein leads are exposed to four sides of one surface of a quadrangular package.

As an example of a bleeding preventing technique there is known a technique disclosed in Japanese Published Unexamined Patent Application No. Hei 11 (1999)-345897. In this unexamined publication is disclosed Fan-out-BGA of a structure having been subjected to processing for the prevention of bleeding of Ag paste, such as the formation of a solder resist dam or blasting (abrasive polishing).

On the other hand, in Japanese Published Unexamined Patent Application No. 2000-196006 is disclosed a QFP (Quad Flat Package) type semiconductor device of a structure wherein lugs projecting toward the interior of a sealing resin are formed on side faces of a die pad for the purpose of improving a close adherence between the die pad and the sealing resin and also improving moisture resistance. According to the structure of this semiconductor device, the back side of the die pad is exposed from the sealing resin.

Further, in Japanese Published Unexamined Patent Application No. Hei 11 (1999)-251494 is disclosed a high-frequency device having a gull wing type wire structure for use in a portable telephone or the like in which a semiconductor element mounting portion serves as ground. According to the technique disclosed therein, not only electrodes on a semiconductor element and the leads are connected together through wires, but also the electrodes on the semiconductor element and the semiconductor element mounting portion are connected together through wires because of a die pad serving as ground. This is called down bonding in the literature just referred to above. Because of down bonding, the semiconductor element mounting portion is larger than the semiconductor element, and in a mounted state of the semiconductor device the semiconductor element mounting portion projects to the outside of the semiconductor device.

SUMMARY OF THE INVENTION

From the standpoint of reducing the size of a semiconductor device and preventing bending of leads serving as external electrode terminals there is used a non-leaded type semiconductor device using one-side molding such as SON or QFN. In a non-leaded type semiconductor device, lead surfaces exposed to one surface of a package constitute a mounting surface and therefore the mounting area is small in comparison with SOP (Small Outline Package) and QFP in which leads are projected from side faces of a package.

In a non-leaded type semiconductor device of a tab exposed structure there exists a keen demand for a down bonding structure wherein electrodes on a semiconductor element (semiconductor chip) and a tab with the chip mounted thereon are connected together using wires, with a view to improving electrical characteristics of particularly a high-frequency device. Thus, it is now a pressing need to develop a package structure which permits down bonding while ensuring high reliability.

In a non-leaded type semiconductor device wherein a tab is larger than a chip, a surface (main surface) of the tab with the chip mounted thereon and resin which constitutes a packages are apt to be peeled off from each other. This peeling-off is ascribable to a one-side molded structure wherein the surface (main surface) of the tab is in contact with the resin, while the back side of the tab is exposed from the resin, and is also ascribable to a thermal stress (thermal strain) induced by a difference in thermal expansion coefficient, $\alpha$, among components.

As an example, the semiconductor element is formed of silicon ($\alpha=3.0\times10^{-6}/°$ C.), while the tab and leads are formed of Cu ($\alpha=1.7\times10^{-5}/°$ C.). An adhesive for connection between the semiconductor element and the tab is Ag paste ($\alpha=3.5\times10^{-5}/°$ C.) constituted by an epoxy resin, wires connected to electrodes on the semiconductor element are Au wires ($\alpha=2.63\times10^{-5}/°$ C.), and the resin which constitutes a package is a biphenyl resin ($\alpha=1.2\times10^{-5}/°$ C.).

In the case of a mounting substrate with a non-leaded type semiconductor device mounted thereon, such as a mother board, e.g., FR-4, the value of $\alpha$ is $1.5\times10^{-5}/°$ C.

Thus, due to a difference in thermal expansion coefficient among components which constitute a non-leaded type semiconductor device or due to a difference in thermal expansion coefficient of the mounting substrate before and after mounting, a strong internal stress is imposed on the tab surface-resin interface, thus making peeling-off of the tab from the resin (package) easier.

To permit down bonding, Ag plating is needed for connecting wires (Au wires) to the tab surface, but the presence of this plating film further deteriorates a close adherence between the tab surface and the resin, thus making peeling-off easier between the tab surface and the resin.

For mounting (fixing) the chip there is used an adhesive such as Ag paste, but in the case of a structure wherein Au wires are connected directly to the tab surface, a liquid component contained in the adhesive bleeds (bleeding phenomenon) and forms a film on the Ag plating, which impedes the bonding (connection) of Au wires, causing lowering of bonding strength and consequent separation. Such lowering of the wire bonding strength caused by the bleeding phenomenon is not limited to the case of Au wire and Ag plating but occurs also in the case of other wires and other plating films.

A gap is formed as a result of peeling-off between the tab surface and the resin. This gap acts as a path of water incoming from the exterior of the package, thus deteriorating the reliability of the down-bonded portion. Particularly, in a tab-exposed type package, it is difficult to ensure a sufficient strength of contact with resin because neither side of the tab is sealed with resin. Moreover, since the tab is not covered with resin, the temperature of the tab becomes very high under heating by a heater during mounting such as solder reflow and therefore the water staying in the gap formed by peeling-off between the tab surface and the resin expands. Consequently, the fear of breakage of the package increases. Such a problem becomes more conspicuous in the case of connecting the back side of the tab with electrodes on a wiring board through solder.

It is an object of the present invention to provide a semiconductor device and a non-leaded type semiconductor device which are high in the reliability of wire connection.

It is another object of the present invention to provide a semiconductor device and a non-leaded type semiconductor device which are high in the reliability of connection of the down-bonded portion.

It is a further object of the present invention to provide a semiconductor device and a non-leaded type semiconductor device which are capable of preventing peeling-off between a tab surface and a package-constituting resin.

It is a further object of the present invention to provide a semiconductor device and a non-leaded type semiconductor device which are high in a close adherence between a semiconductor device mounting tab and a package constituting resin and also high in moisture resistance.

The above and other objects and novel features of the present invention will become apparent from the following description and the accompanying drawings.

The following is a brief description of typical inventions out of those disclosed herein.

(1) A semiconductor device comprising:
a seal member formed of an insulating resin;
a tab whose back side is exposed to a mounting surface of the seal member, the tab having, on a surface thereof opposite to the back side, a semiconductor element fixing area and wire connection areas;
tab suspension leads exposed to the mounting surface of the seal member and contiguous to the tab;
a plurality of leads whose back sides are exposed to the mounting surface of the seal member;
a semiconductor element positioned within the seal member and fixed through an adhesive onto the semiconductor element fixing area on the surface of the tab in such a manner that a back side thereof is opposed to the tab surface;
a plurality of electrodes formed on a main surface of the semiconductor element;
electrically conductive wires for electrically connecting the plural electrodes and surfaces of the leads with each other; and
electrically conductive wires for electrically connecting the electrodes on the semiconductor element and the wire connection areas on the tab with each other,
characterized in that the tab is formed larger than the semiconductor element so that outer peripheral edges of the tab are positioned outside outer peripheral edges of the semiconductor element, and
a groove is formed in the surface of the tab so as to be positioned between the semiconductor element fixing area and the wire connection areas.

The aforesaid groove surrounds the whole circumference of the semiconductor element fixing area. The adhesive is not applied to the wire connection areas on the tab. A plating film is formed selectively on the wire connection areas of the tab and the surfaces of the leads, and the wires are connected onto the plating film. The area of the surface of the tab is larger than that of the back side of the tab. The tab has a section which is in the shape of an inverted trapezoid. The adhesive is applied also to the interior of the groove and the semiconductor element is larger than the semiconductor element fixing area and is fixed also onto the groove through the adhesive. The groove is selectively formed correspondingly to areas where the wires are connected. The tab is quadrangular. The groove is selectively formed in a mutually independent manner without being formed at four corners of the tab. The groove is selectively formed in a mutually independent manner along sides of the quadrangle of the tab. Grooves are formed in the surfaces of the leads respectively and the wires are connected at positions closer to the semiconductor element with respect to the grooves formed in the surfaces of the leads.

According to the above means (1), (a) since the tab is larger than the semiconductor element so that outer peripheral edges thereof are positioned outside outer peripheral edges of the semiconductor element, the electrodes on the semiconductor element can be connected (down-bonded) to any nearby positions on the tab surface. In this case, since a tab surface portion is present outside the whole circumference of the semiconductor element, the down-bonding wires can be made shortest in length. In down bonding, ground electrodes are connected to the tab surface which serves as a common ground. In this case, any ground electrodes on the semiconductor element can be connected to nearby tab surface portions, so where the semiconductor device is a high-frequency device, it is possible to stabilize the ground potential of circuit.

(b) In a tab surface portion located between the semiconductor element fixing area to which the semiconductor element is fixed and the wire connection areas to which down-bonding wires are connected there is formed a groove so as to surround the semiconductor element fixing area. Therefore, the bleeding phenomenon that the resin component present within the Ag paste oozes out to the tab surface and reaches the wire connection areas is stopped in the groove portion; in other words, the resin component thus oozing out can be prevented from reaching the wire connections beyond the groove. That is, the adhesive is not present outside the groove. As a result, the wires are connected onto the Ag plating film without being connected onto the resin component as in the prior art, thus permitting strong connection of the wires and improving the reliability of wire connection. That is, the reliability of down-bonding connection is improved.

(c) As mentioned in the above (b), since the bleeding of the resin component from Ag paste is stopped in the aforesaid groove, the bleeding area of the resin component becomes smaller than in the prior art and hence it is possible to prevent lowering of the bonding force between the tab and the resin. As a result, the tab-resin peeling off becomes difficult to occur and the moisture resistance of the package is improved.

(d) Since the resin which forms the package enters the foregoing groove, the tab-package bonding area (close contact area) becomes wider than in the prior art and the tab-resin bonding force becomes high, thus resulting in that the tab and the package (resin) become difficult to peel off from each other and the moisture resistance of the package is improved.

(e) Since the foregoing groove is present, in the case where the tab-package peeling-off occurs at a portion where an internal stress at the tab-resin interface is large and the bonding strength is low, such as an Ag paste-applied portion or an Ag-plated portion, it is possible to prevent propagation of the tab-resin peeling-off and hence prevent the formation of a large gap which would induce the entry of water.

According to the structure using the groove portion to prevent bleeding, in comparison with other bleeding preventing methods, not only it is easy to fabricate the groove portion from the metallic plate as the material of the lead frame but also it is not necessary to ensure a margin for a plane layout of both chip mounting portion and groove portion; besides, even part of the groove can be disposed under the chip. Therefore, it is possible to realize the reduction in size of the tab. Especially in the case of a package of the type wherein leads are arranged around a tab, it is possible to realize the reduction in size of the package.

(f) The section of the tab is in the shape of an inverted trapezoid and the area of the tab surface for fixing the semiconductor element is larger than that of the back side of the tab. Therefore, tab ends are of a sectional shape with sharp ends, which bite and are buried into the resin, thus making it difficult for the tab to peel off from the package.

(g) In the structure wherein the tab is in the shape of an inverted trapezoid and a groove is formed in the tab surface, no lug is formed on the tab surface. Thus, by adopting a tab shape with no lug present around the chip mounting area (semiconductor element fixing area), it is possible to make a wire loop small. Particularly, by making the wire loop length small, it is possible to arrange leads in the vicinity of the tab, whereby it is possible to attain the reduction in size of the package. Further, by making the wire loop height small it is possible to decrease the height of the seal member and attain the reduction in thickness of the package.

(h) Since each lead is formed with a groove, the area of contact with the resin becomes larger than in the prior art and hence it becomes difficult for the lead to peel off from the resin. Besides, since the resin enters the groove formed in the resin, this bite-in structure makes it even more difficult for the lead to peel off from the resin. Further, since the groove is present, the path of water entering the interior from the peripheral surface of the package along the surfaces of the leads becomes long and hence it is possible to prevent water-corrosion of the wires which are connected to the leads.

(i) Since Ag plating film is formed on the wire connection areas of the leads and the wires are fixed onto the Ag plating film, it is possible to improve the wire connection strength.

(j) According to the structure of the present invention thus permitting the prevention of peeling-off of wire connections and peeling-off between the tab and the resin, it is possible to make an improvement of yield in the manufacture of the semiconductor device and hence possible to reduce the manufacturing cost of the semiconductor device.

DETAILED DESCRIPTION OF PREFERRED EMBODIMENTS

Figure 1:
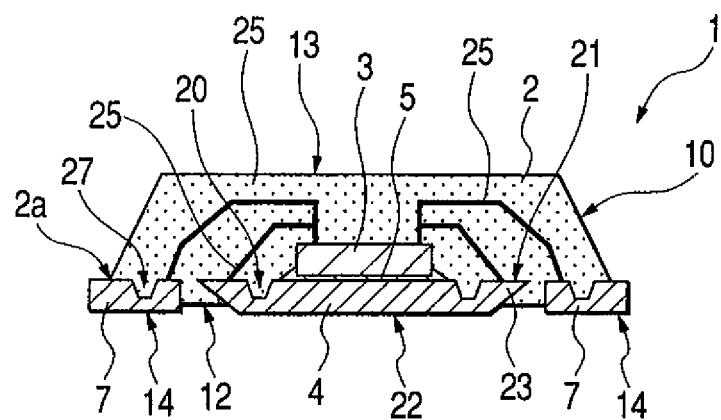
FIG. 1 is a schematic sectional view of a non-leaded type semiconductor device according to a first embodiment of the present invention.

Embodiments of the present invention will be described in detail hereinunder with reference to the accompanying drawings. In all of the drawings for illustration of the embodiments, portions having the same functions are identified by the same reference numerals and repeated explanations thereof will be omitted.

(First Embodiment)

FIGS. 1 to 7 illustrate a semiconductor device, especially a non-leaded type semiconductor device, and a method for manufacturing the same, according to a first embodiment of the present invention. In the first embodiment reference will be made to an example of application of the present invention to a QFN type semiconductor device in which a tab, tab suspension leads contiguous to the tab, and leads are exposed to a back side of a quadrangular package.

As shown in FIGS. 1 to 4, the QFN type semiconductor device, indicated at 1, has a flat, quadrangular (square) seal member (package) 2 formed of an insulating resin. A semiconductor element (semiconductor chip; chip) 3 is buried in the interior of the package 2. The semiconductor chip 3 is fixed to a surface (main surface) of a quadrangular tab 4 with an adhesive 5 (see FIG. 2).

Figure 4:
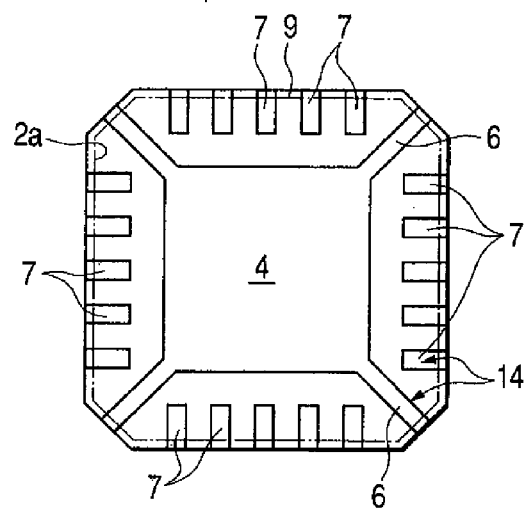
FIG. 4 is a bottom view of the non-leaded type semiconductor device.

As shown in FIG. 4, a back side (lower surface) of the package 2 serves as a mounting surface. The tab 4, tab suspension leads 6, and one surfaces (mounting surfaces 14) of leads 7 are exposed to the back side of the package 2. The tab 4, the tab suspension leads 6, and the leads 7 are formed by a single, patterned lead frame made of copper and are therefore equal in thickness in this embodiment.

As shown in FIG. 4, four corners of the tab 4 are contiguous to the tab suspension leads 6 which extend radially, and in the form of the lead frame they support the tab 4. Around the tab 4 are arranged plural leads 7 at predetermined intervals along the sides of the quadrangular package 2 in such a manner that their inner ends are in proximity to the tab 4. Outer ends of the tab suspension leads 6 and leads 7 extend up to the peripheral edges of the package 2.

The package 2 is in a flat quadrangular shape and corner portions thereof are chamfered as slant faces 10. One of the slant faces 10 was contiguous to a resin pouring gate when the package 2 was formed. The other three slant faces 5 were contiguous to air vents for the escape of air therethrough when the package 2 was subjected to molding.

Side faces of the package 2 are formed as slant faces 11. The slant faces 11 result from forming side faces of a mold cavity as slant faces to facilitate extraction of the package from the cavity. Therefore, as shown in FIG. 1, an upper surface 13 of the package 2 is smaller in size than a back side 12 of the package. The outer ends of the tab suspension leads 6 are exposed to the slant faces 10 of the package 2 (see FIGS. 3 and 4).

Figure 2:
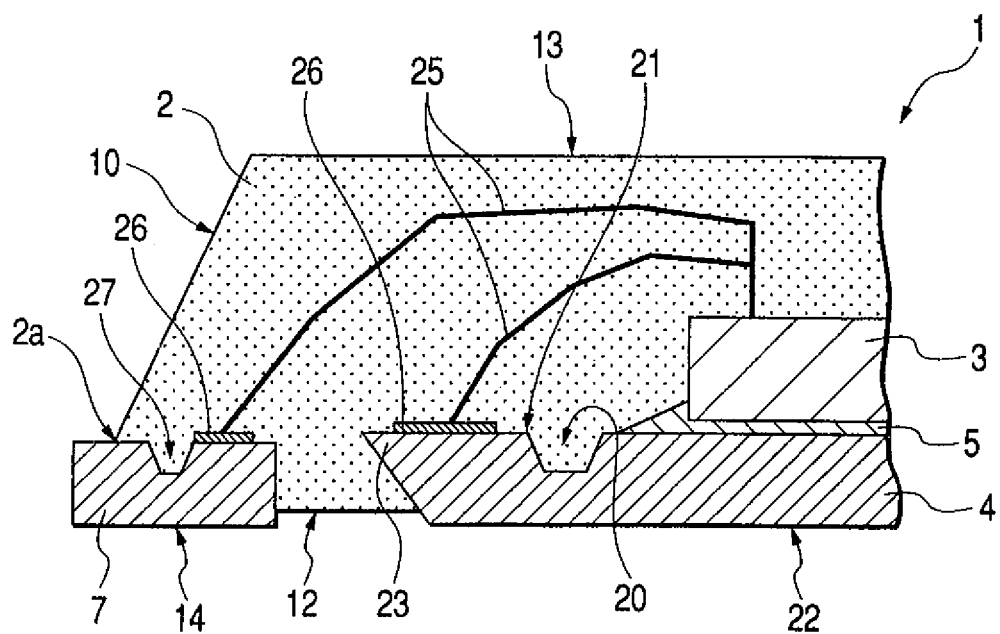
FIG. 2 is an enlarged sectional view showing a part of the non-leaded type semiconductor device.

As shown in FIGS. 1 and 2, the leads 7 and the tab suspension leads 6, on their sides covered with the package 2, project slightly outwards from rising edges 2a of the package 2. This results from the leads 7 and the tab suspension leads 6 being cut at their portions deviated from the package 2. For example, the projection length is not larger than 0.1 mm from the rising edges 2a.

Figure 3:
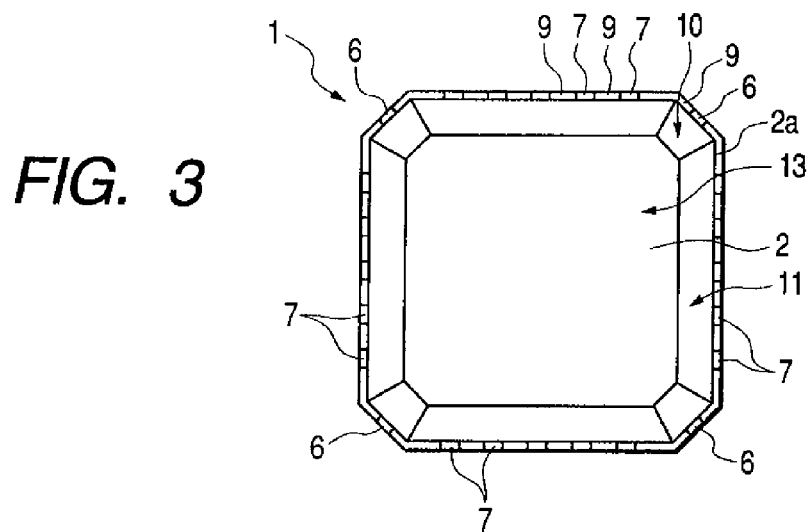
FIG. 3 is a plan view of the non-leaded type semiconductor device.

As shown in FIGS. 3 and 4, resin burr 9 is present between the leads 7 and also between the leads 7 and the tab suspension leads 6, but the resin burr 9 is also cut with a die and a punch, so each peripheral edge portion of the package 2 becomes rectilinear without any unevenness defined by edges of the resin burr 9 and the outer ends of the leads 7 and the tab suspension leads 6. The resin burr 9 is present outside the rising edges 2a and is equal to or slightly smaller than the leads 7 in thickness.

That the resin burr 9 is thinner than the leads 7 in this embodiment is for the following reason. In one-side molding by transfer molding, a resin sheet is stretched between upper and lower mold halves of a transfer mold and molding is performed in such a manner that one side of the lead frame comes into contact with the sheet. Consequently, the sheet bites in between the leads and so the resin burr 9 becomes thin, thus giving rise to a slight difference in height between the back side of the package and the leads as well as the tab (see FIGS. 1 and 2). In the case where the sheet is not used, the thickness of the resin burr 9 is equal to that of the leads 7 or may become larger depending on the degree of clearance.

After the one-side molding by transfer molding, a plating film is formed on the surfaces of the leads 7 and the tab suspension leads 6 and the presence of this plating film causes a further increase of the difference in height between the back side 12 of the package 2 and the leads 7 as well as the tab 4.

Such a structure wherein the mounting surfaces 14 as back sides of the leads 7 and the tab suspension leads 6 are offset is characteristic in that the mounting with solder is effected in a satisfactory manner because a solder wet area is specified when the semiconductor device 1 is mounted on a wiring board such as a mounting substrate.

Figure 5:
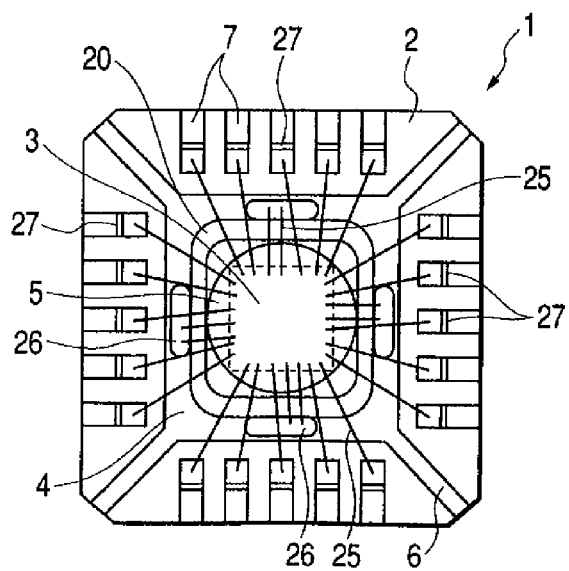
FIG. 5 is a schematic diagram showing an internal structure of the non-leaded type semiconductor device.

On the other hand, as shown also in FIG. 5, the semiconductor element 3 is fixed through the adhesive 5 to the surface (main surface) of the tab 4 within the package 2. For example, Ag paste is used as the adhesive 5. A resin component of the Ag paste is apt to ooze out, so for stopping the bleeding of the resin component a groove 20 is formed so as to surround a semiconductor element fixing area which is for fixing the semiconductor element 3. The groove 20 is formed by etching to a depth which is about half of the thickness of the tab 4. That is, the groove 20 is formed by half etching. As shown in FIG. 2, the adhesive 5 stops inside the groove 20. For attaining this condition, the amount of Ag paste to be fed to the semiconductor device fixing area is adjusted. If the amount of Ag paste is large, the resin component thereof merely oozes out and gets into the groove 20. It is seldom that the resin component gets over the groove 20 and protrude to the outside of the groove 20. This is because the groove 20 is a long endless groove which surrounds the semiconductor element fixing area. However, even if the groove 20 is formed so as to surround the semiconductor element fixing area intermittently as will be explained later in another embodiment, if intermittent grooves are suitably positioned, it is possible to fully prevent bleeding of the resin component to wire connection areas located outside the groove 20 on the tab 4. Also by forming the groove 20 so as to surround the wire connection areas where the tab 4 and bonding wires are connected together, it is possible to prevent bleeding of the resin component from Ag paste to the wire connection areas.

The groove 20 may be formed by pressing work. If a V groove is formed by pressing, the surrounding portion of the V groove is deformed and rises. The amount of this rise depends on the depth and width of the V groove, but is generally 5 μm or so. In the presence of this raised portion, the bleeding of the resin component from Ag paste in a chip bonding step is stopped and thus it is possible to prevent stain (bleeding phenomenon) of the wire connection areas.

Due to the presence of the groove 20, moreover, the area of contact (close contact area) between the tab 4 and a biphenyl resin which constitutes the package 2 increases. Further, since the resin bites into the groove 20 in the tab 4, it becomes difficult for the tab 4 to peel off from the resin.

Figure 10:
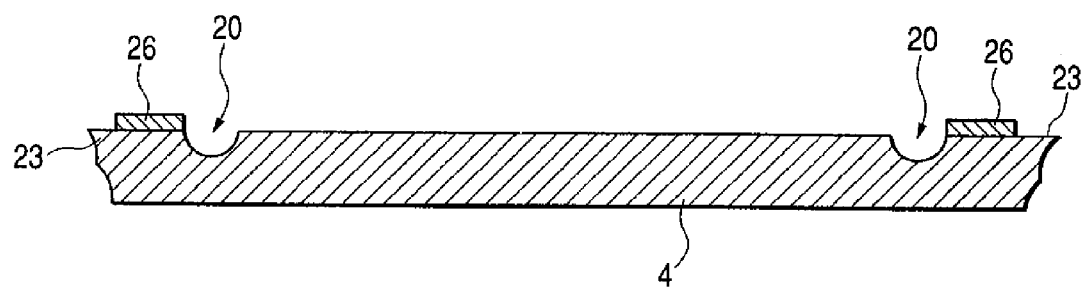
FIG. 10 is an enlarged sectional view of a tab used in the lead frame.
Figure 11:
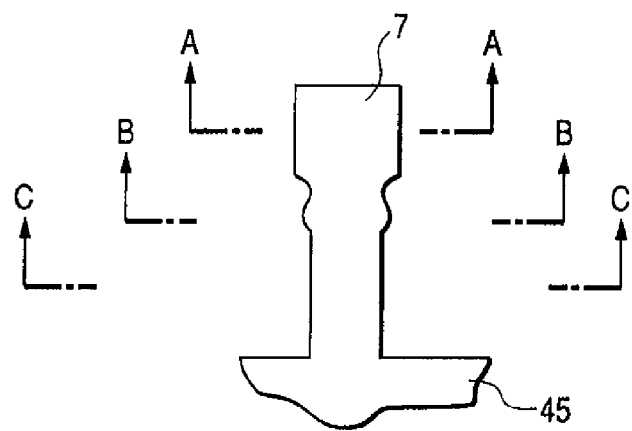
FIG. 11 is an enlarged plan view showing one lead portion in a lead frame according to a modification of the first embodiment.

As shown in FIG. 10, the tab 4 has an inverted trapezoid section, and the area of a tab surface 21 buried in the resin which constitutes the package 2 is larger than the area of a tab back side 22 which is exposed from the package 2. Consequently, projecting portions 23 of a triangular section projecting from peripheral edges of the tab 4 bite into the package 2, whereby the peeling-off of the tab 4 from the package 2 can be prevented more surely and the close adherence between the tab and the resin is further improved.

The inverted trapezoid shape of the tab 4, i.e., the projecting portions 23 of a triangular section projecting from peripheral edges of the tab 4, can be formed by forming an etching resist pattern on the surface side larger than that on the back side. For example, by adopting an etching pattern on the surface side 0.1 mm larger in outer periphery size than an etching pattern on the back side, there can be formed such projecting portions 23 as shown in FIG. 10.

On an upper surface of the semiconductor element 3 there are formed electrodes along the sides of the quadrangular shape thereof though not shown. One ends of wires 25 are connected to the electrodes. Opposite ends of the wires 25 are connected to the surfaces of inner end portions of the leads 7. A portion of the wires 25 are connected to surface portions of the tab 4 located outside the groove 20 (down bonding). In this down bonding, the tab 4 is used as a common ground. In a high-frequency device it is desired that many portions be grounded. Down bonding is preferable in this point. Plating film 26 is formed selectively on the wire connection areas of the leads 7 and the tab 4 to effect a satisfactory connection of the wires. For example, the plating film 26 is an Ag plating film. In this way the wire connection strength is improved. Since the resin component of the adhesive 5 for fixing the semiconductor element 3 is not present on the wire connection areas on the tab surface, the connection strength of the wires 25 connected to the tab surface portions located outside the groove 20 becomes high and the peeling-off of wires which results from the intervention of the resin component no longer occurs.

Further, in surface portions located near the inner ends of the leads 7 are formed grooves 27 in the transverse direction of the leads. The wire connection areas on the package 2 correspond to the areas between the grooves 27 and the inner ends of the leads. The area of contact (close contact area) between the leads 7 and the resin increases because of the presence of the grooves 27, and the resin bites in the grooves 27, so that the connection strength between the leads 7 and the package 2 is improved and the leads 7 become difficult to peel off from the package 2.

Figure 6:
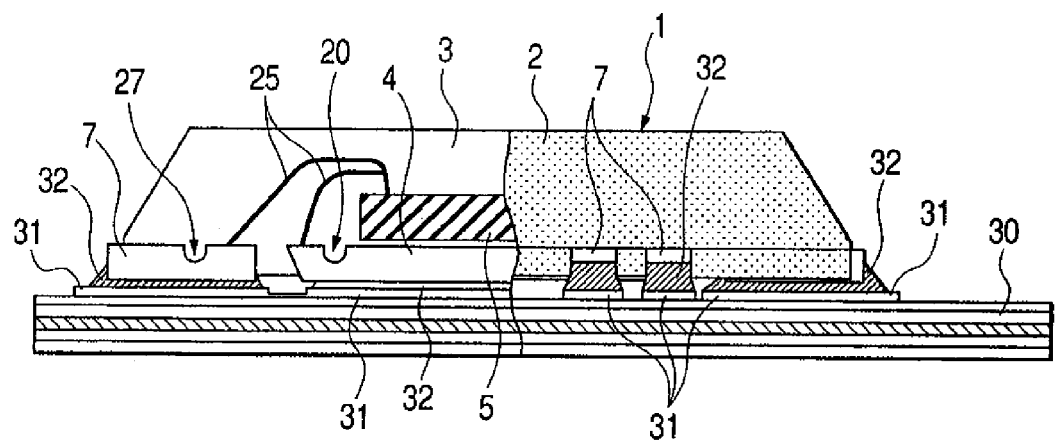
FIG. 6 is a schematic sectional view showing a mounted state of the non-leaded type semiconductor device of the first embodiment.
Figure 7:
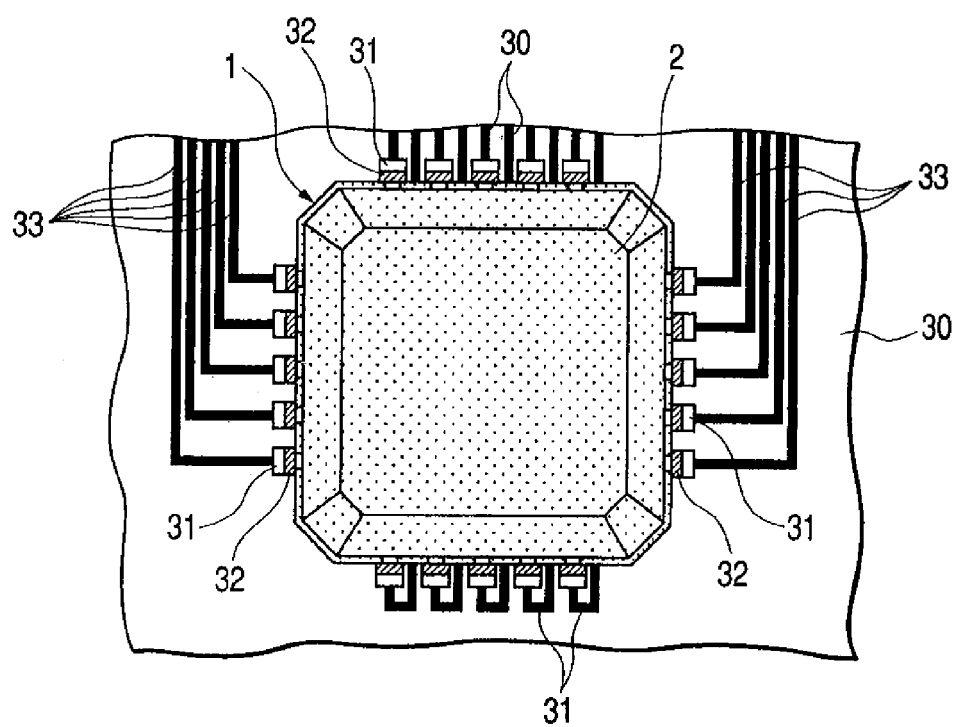
FIG. 7 is a schematic plan view showing a mounted state of the non-leaded type semiconductor device of the first embodiment.

FIGS. 6 and 7 are sectional views of the semiconductor device 1 as mounted on a mounting substrate 30 which is a wiring board. On one surface of the mounting substrate 30 are formed electrodes (lands) 31 correspondingly to the leads 7 serving as external electrode terminals of the semiconductor device 1 and also correspondingly to the tab suspension leads 6. The leads 7 serving as external electrode terminals of the semiconductor device 1 and the tab suspension leads 6 are superimposed on the lands 31 and are connected to the lands electrically through a bonding material 32, say, solder. As shown in FIG. 7, the lands 31 are formed by portions of wiring lines 33.

In this first embodiment, in consideration of reliability and for widening the area of contact between the tab surface and the resin which forms the package, the tab surface is present within the package. Moreover, in consideration of heat radiability and for transmitting heat generated in the chip over a wide area, the tab is formed larger than the chip. Further, in consideration of a close adherence between the tab and the resin and for causing tab edges to bite into the resin like eaves, the section of the tab is formed in the shape of an inverted trapezoid.

An example of dimensions of various portions in the semiconductor device 1 will now be given. The lead frame (tab 4, tab suspension leads 6, leads 7) is 0.2 mm thick, the chip 3 is 0.28 mm thick, the semiconductor device 1 is 1.0 mm thick, each lead 7 is 0.2 mm wide by 0.5 mm long, the wire connection area on each lead 7 is 0.2 to 0.3 mm from the inner end of the lead, a wire connection (point) on the tab 4 is 1.0 mm from an end of the chip 3, the groove 20 formed in the surface of the tab 4 is 0.15 mm wide, the distance from an outer edge of the groove 20 to the wire connection (point) is 0.15 mm, the distance from the wire connection (point) to an outer peripheral edge of the tab 4 is 0.10 mm, and the spacing between the tip of each projecting portion 23 of the tab 4 and the inner end of each lead 7 is 0.2 mm.

Thus, the wires located in the down-bonded portions can be shortened about 0.8 mm in planar size as compared with the other wires. Consequently, in a semiconductor device for which a high-frequency characteristic is required, there can be obtained an effect of preventing the deterioration of electrical characteristics.

Further, by forming the section of the tab in an inverted trapezoid, the distance between an exposed end of the tab and the inner end of each lead can be taken large in comparison with the distance between the tip of each projecting portion 23 of the tab 4 and the inner end of each lead 7, so that the degree of margin against short-circuit between the tab 4 and the leads 7 at the time of substrate mounting becomes larger. That is, as compared with the case where the section of the tab is not formed in an inverted trapezoid shape, it becomes possible to reduce the package size by an amount corresponding to a difference of 0.2 mm in size between the upper surface of the tab and the exposed surface of the tab.

Figure 8:
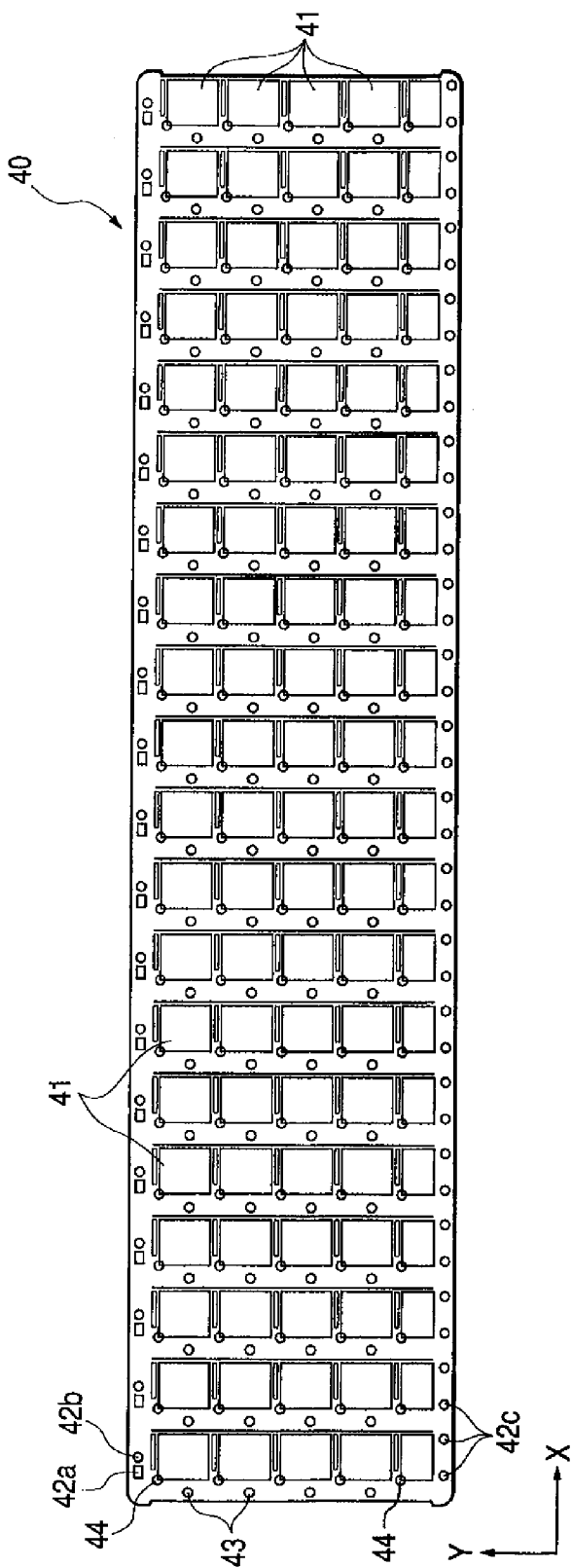
FIG. 8 is a schematic plan view of a lead frame used in the manufacture of the non-leaded type semiconductor device of the first embodiment.

Next, a method of manufacturing the semiconductor device 1 of this first embodiment will be described below with reference to FIGS. 8 to 17. FIG. 8 is a schematic plan view of a lead frame 40 of a matrix configuration which is used in manufacturing the QFN type semiconductor device 1 of the first embodiment.

The lead frame 40 comprises unit lead frame patterns 41 arranged in twenty rows in an X direction and four rows in a Y direction. A total of eighty semiconductor devices 1 can be produced from one lead frame 40. On both sides of the lead frame 40 are formed guide holes 42*a* to 42*c* to be used for conveyance and positioning of the lead frame 40.

In transfer molding, a runner is positioned on the left-hand side of each column. For stripping runner-cured resin from the lead frame 25 by ejection of ejector pins there are formed ejector pin holes 43 which permit ejector pins to pass therethrough. Also as to gate-cured resin having cured in a gate portion branching from the runner and flowing into the cavity, for stripping it from the lead by the ejection of ejector pins, there are formed ejector pin holes 44 which permit ejector pins to pass therethrough.

Figure 9:
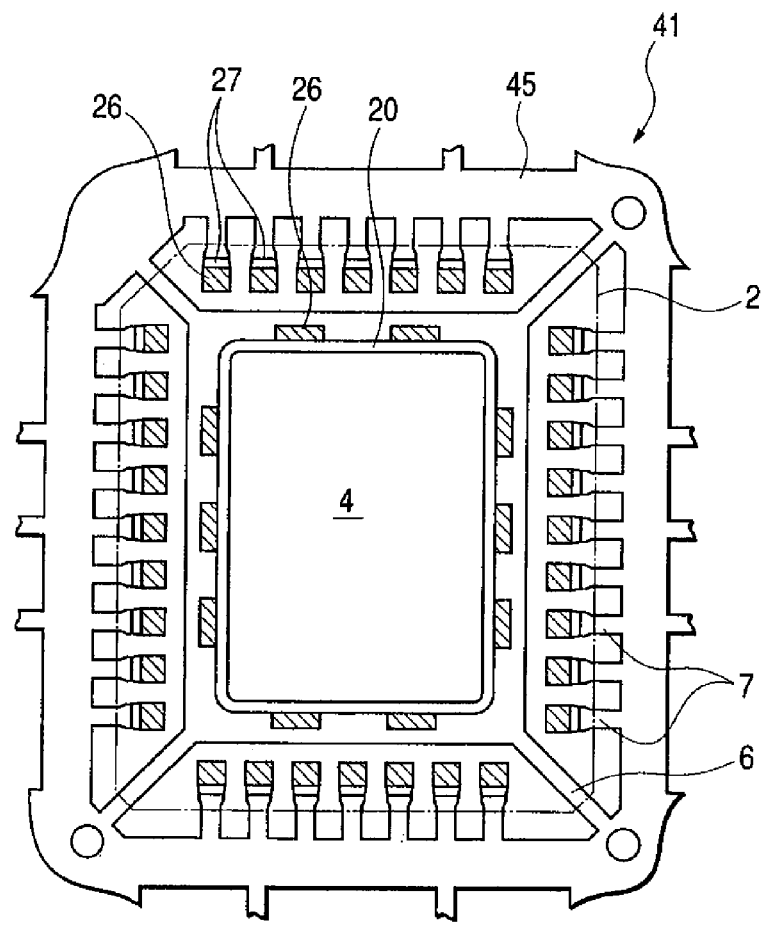
FIG. 9 is a plan view showing a part of a unit lead frame pattern as a constituent of the lead frame.

FIG. 9 is a plan view showing a part of each unit lead frame pattern 41. It is to be understood that the unit lead frame pattern 41 is an actually fabricated pattern and so is not always coincident with the schematic diagrams of FIGS. 1 to 6.

Each unit lead frame pattern 41 has a rectangular frame portion 45. Tab suspension leads 6 extend from the four corners of the frame portion 45 and support the tab 4 located centrally. Plural leads 7 extend inwards from inner ends of the sides of the frame portion 45 and their inner ends are in proximity to the outer peripheral edges of the tab 4. Grooves 20 and 27 are formed in the surfaces of the tab 4 and the leads 7, a plating film 26 is formed in the wire connection areas located outside the groove 20 and the wire connection areas located on the inner end sides of the leads 7 (the dotted areas in FIG. 9), and the tab 4 has an inverted trapezoid section (see FIG. 10). These points are the same as above. A rectangular portion represented by a dash-dot line in FIG. 9 is a contour line of the package 2 formed of an insulating resin.

Figure 12:
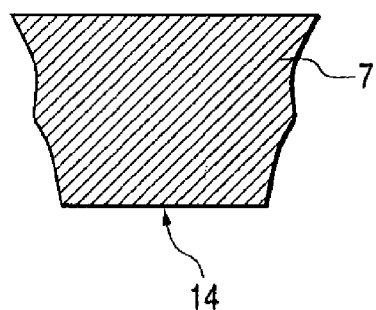
FIG. 12 is a sectional view taken along line A-A in FIG. 11.
Figure 13:
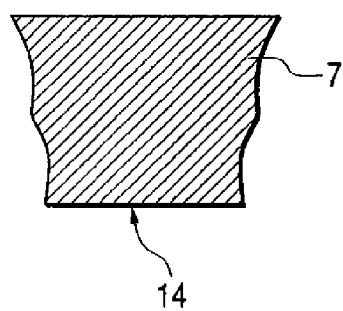
FIG. 13 is a sectional view taken along line B-B in FIG. 11.
Figure 14:
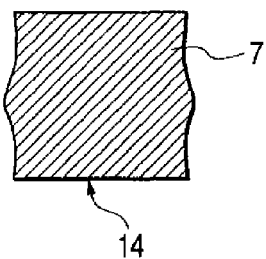
FIG. 14 is a sectional view taken along line C-C in FIG. 11.

FIGS. 11 to 14 illustrate a modified example of a lead 7. The lead 7 has such a section as shown in FIGS. 12 and 13 in which a buried side of the lead into the package 2, i.e., the surface of the lead 7, is formed wide and its side serving as a mounting surface 14 is made narrow, the lead 7 becomes difficult to be extracted from the package 2 as is the case with the tab 4.

Figure 15:
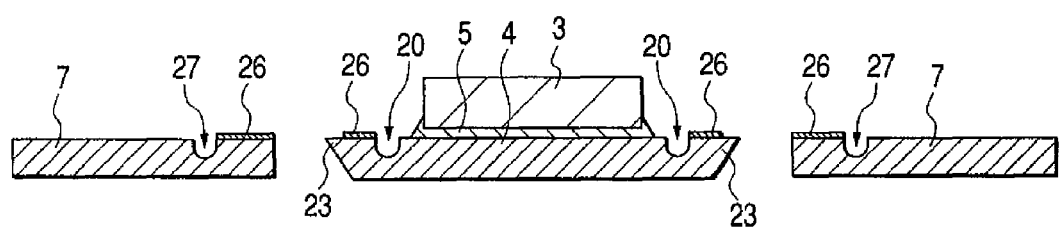
FIG. 15 is an enlarged sectional view of a part of the lead frame, showing a mounted state of a semiconductor chip on a main surface of a tab in the manufacture of the non-leaded type semiconductor device of the first embodiment.

In case of manufacturing the semiconductor device 1 with use of such a lead frame 40, as shown in FIG. 15, first Ag paste as the adhesive 5 is applied a predetermined amount to the semiconductor element fixing area inside the groove 20 formed in the tab 4. Thereafter, the semiconductor element 3 is positioned onto the Ag paste. Next, the Ag paste is baked to harden, allowing the semiconductor element 3 to be fixed onto the surface (main surface) of the tab 4. In this step the amount of the Ag paste to be fed is controlled accurately. As a result, the Ag paste and a resin component thereof no longer reach the wire connection areas on the tab 4 beyond the groove 20.

Figure 16:
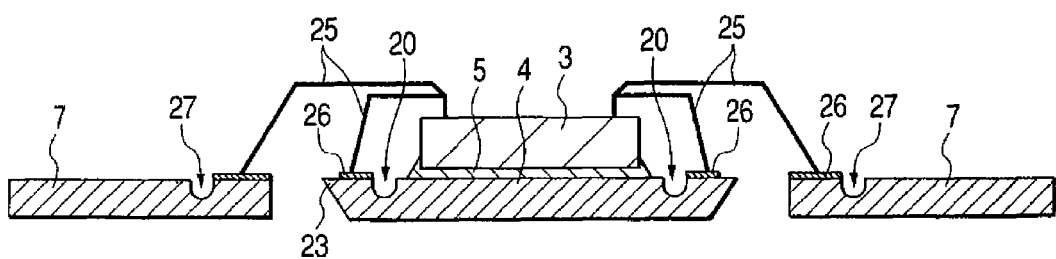
FIG. 16 is an enlarged sectional view of a part of the lead frame after wire bonding in the manufacture of the non-leaded type semiconductor device of the first embodiment.

Next, as shown in FIG. 16, wire bonding is performed between the electrodes on the semiconductor element 3 and the leads 7 and also between the electrodes on the semiconductor element 3 and the tab surface portions of the wire connection areas on the tab 4 located outside the groove 20. Wires are down-bonded between the electrodes on the semiconductor element 3 and the tab 4. Since the plating film 26 formed by Ag plating is provided in the wire connection areas of the package 2 and the tab 4, there is attained a high connection strength of wires.

Moreover, since neither the Ag paste nor the resin component oozing out from the Ag paste reaches the wire beyond the groove 20 formed in the tab 4, the wire connection areas on the tab 4 are kept clean. Consequently, there are obtained satisfactory down-bonded connections and high down bonding strength, with no peeling-off of wires from the wire connection areas on the tab 4.

Figure 17:
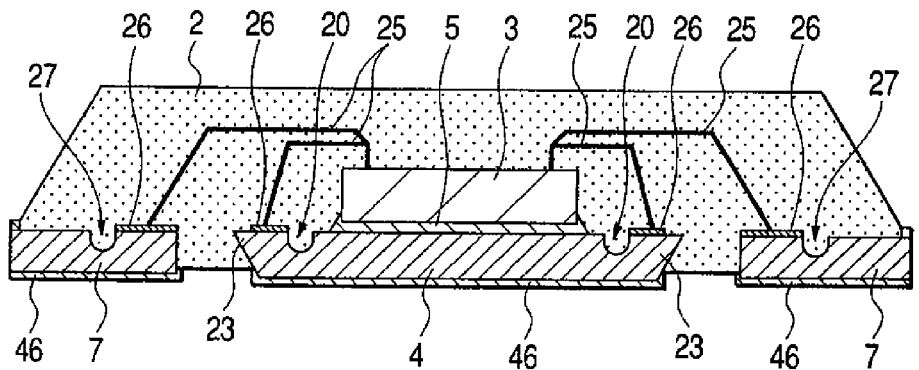
FIG. 17 is an enlarged sectional view of the non-leaded type semiconductor device of the first embodiment after resin-sealing and removal of an unnecessary lead frame portion by cutting in the manufacture of the semiconductor device.

Next, as shown in FIG. 17, one-side molding is performed for a predetermined area by the conventional transfer molding method, whereby the package 2 is formed of an insulating resin. Thereafter, a solder plating treatment is performed, with the result that a solder plating film 46 is formed on the surfaces of the tab 4, tab suspension leads 6 and leads 7. Further, unnecessary lead frame portions are cut off, affording such a semiconductor device 1 as shown in the same figure.

According to this first embodiment there are obtained the following effects.

(1) Since the tab 4 is formed larger than the chip 3 so that its outer peripheral edges are positioned outside the outer peripheral edges of the semiconductor element (chip) 3, the electrodes on the chip 3 can be connected (down-bonded) to nearby tab surface portions no matter which positions they may assume. In this case, since the tab surface portion is present outside the whole circumference of the chip 3, it is possible to make the down bonding wires shortest. In down bonding, ground electrodes are connected to the tab surface which serves as a common ground, but since the ground electrodes on the chip 3 can all be connected to nearby tab surface portions, it is possible to stabilize the ground potential of circuit in the case of the semiconductor device being a high-frequency device.

(2) In the tab surface portion between the semiconductor element fixing area to which the chip 3 is fixed and the wire connection areas to which down bonding wires 25 are connected there is formed the groove 20 so as to surround the semiconductor element fixing area. With the groove 20, the bleeding phenomenon such that the adhesive 5 for fixing the chip 3 to the tab 4, i.e., the resin component contained in Ag paste, oozes out to the tab surface and reaches the wire connection areas, can be stopped in the groove portion and is thereby prevented from reaching the wire connections beyond the groove 20. That is, the adhesive 5 does not exist any longer in the groove 20. As a result, the wires 25 are connected onto the Ag plating film without being connected onto the resin component as in the prior art, thus making it possible to effect a firm connection of the wires 25 and hence the connection reliability of the wires 25 is improved. That is, the reliability of the down bonding connection becomes higher.

(3) As noted in the above (2), the area of bleeding of the resin component from Ag paste becomes small as compared with that in the prior art because the bleeding is stopped in the groove 20, whereby it is possible to prevent a lowering of the bonding strength between the tab 4 and the resin (package 2). As a result, peeling-off between the tab 4 and the resin becomes difficult to occur and the package 2 becomes more resistant to moisture.

(4) Since the resin which forms the package 2 gets into the groove 20, the area of contact (close contact area) between the tab 4 and the package 2 becomes wide in comparison with that in the prior art and the tab-resin bonding force is improved, with the result that the tab 4 and the package (resin) become difficult to peel off from each other and the moisture resistance of the package 2 becomes high.

(5) With the groove 20, in the event there occurs tab-resin peeling-off at a portion where an internal stress at the tab-resin interface is large and the bonding strength is low, such as the Ag paste-applied portion or the Ag-plated portion, it is possible to prevent propagation of the peeling-off and hence prevent water from entering into a large gap caused by the propagation of peeling-off.

According to the structure using the groove portion to prevent bleeding, in comparison with other bleeding preventing methods, not only it is easy to form the groove portion from the metallic plate as the material of the lead frame but also it is not necessary to ensure a margin for a plane layout of both chip mounting portion and groove portion. Further, it is even possible to dispose part of the groove under the chip. Therefore, it is possible to attain the reduction in size of the tab. Especially in a package of the type wherein leads are arranged around a tab, it is possible to reduce the package size.

(6) The tab 4 has an inverted trapezoid section and the area of the tab surface for fixing the chip 3 is larger than that of the back side of the tab 4. Therefore, tab ends are of a sectional shape with sharp ends (projecting portions 23), which bite and are buried into the resin, so that the tab 4 becomes difficult to peel off from the package 2.

(7) In the structure wherein the tab 4 is in an inverted trapezoid shape and the groove 20 is formed in the surface of the tab, there is formed no lug on the tab surface. Thus, by adopting a tab shape with no lug present around the chip mounting area (semiconductor element fixing area), it is possible to make a wire loop small. Particularly, by making the wire loop length small, it is possible to arrange leads 7 in the vicinity of the tab 4 and hence possible to realize the reduction in size of the package 2. Further, by making the wire loop height small it is possible to decrease the height of the seal member 2 and attain the reduction in thickness of the package 2.

(8) Since each lead 7 is formed with the groove 27, the area of contact with the resin becomes larger than in the prior art and hence it becomes difficult for the lead 7 to peel off from the resin. Besides, since the resin gets into the groove 27 formed in each lead 7, this bite-in structure makes it further difficult for the lead 7 to peel off from the resin. With the groove 27, moreover, the path of water entering the interior from the peripheral surface of the package along the surfaces of the leads 7 becomes long and therefore it is possible to prevent water-corrosion of the wires 25 which are connected to the leads 7.

(9) Since Ag plating film (plating film 26) is formed on the wire connection areas of the leads 7 and the wires 25 are fixed onto the Ag plating film, it is possible to improve the connection strength of the wires 25.

(10) According to the structure of the present invention thus permitting the prevention of peeling-off of wire connections and peeling-off between the tab 4 and the resin, it is possible to make an improvement of yield in the manufacture of the semiconductor device and so possible to reduce the manufacturing cost of the semiconductor device.

(11) Since it is possible to narrow the spacing between the tips of the projecting portions 23 of the tab 4 and the inner ends of the leads 7, it is possible to reduce the size of the package 2 and hence possible to reduce the size of the semiconductor device 1.

(Second Embodiment)

Figure 18:
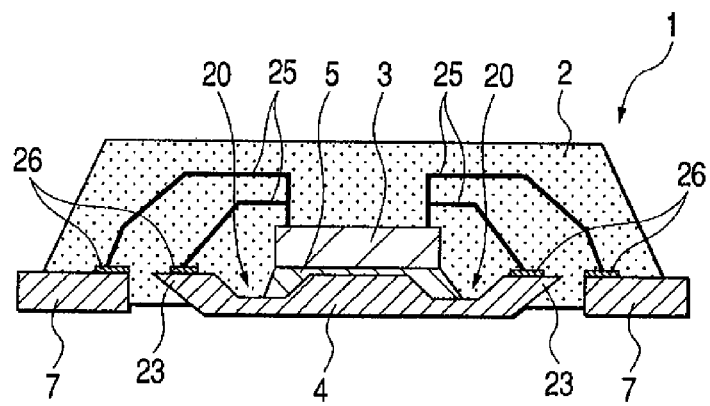
FIG. 18 is a schematic sectional view of a non-leaded type semiconductor device according to a second embodiment of the present invention.
Figure 19:
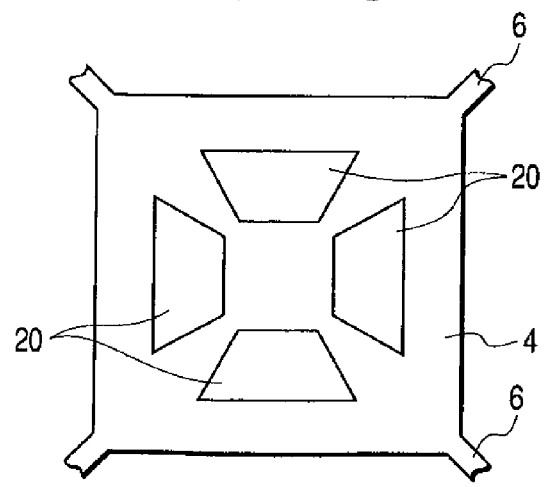
FIG. 19 is a schematic enlarged plan view of a tab used in the non-leaded type semiconductor device of the second embodiment.

FIGS. 18 and 19 illustrate a non-leaded type semiconductor device according to another embodiment (second embodiment) of the present invention, of which FIG. 18 is a schematic sectional view of the non-leaded type semiconductor device and FIG. 19 is a schematic enlarged plan view of a tab.

According to the second embodiment, in the semiconductor device 1 constructed as in the previous first embodiment, the groove 20 formed in the surface of the tab 4 is made wide and is allowed to bite into the semiconductor element fixing area. Although leads 7 used in the semiconductor device 1 of the second embodiment are not formed with grooves 7, it goes without saying that grooves may be formed in the leads 7.

In the second embodiment, since grooves 20 are formed wide and are allowed to bite into the semiconductor element fixing area (chip bonding area), the tab 4 can be reduced in size as compared with the construction of the previous first embodiment wherein an independent groove is formed between the semiconductor element fixing area and the wire connection areas.

In the second embodiment, as shown in FIG. 19, the grooves 20 are not formed in the corner portions of the square taking the stability in wire connection into account. That is, the grooves 20 extend each independently along the sides of the square. The four corners of the chip 3 are supported by the tab 4 through an Ag paste layer, whereby the heat transfer characteristic is improved and it becomes possible to fix the chip 3 stably, so that there is attained an effect of improving the stability of the wire pulling strength.

As to the lead frame, since the grooves 20 are not formed in the corner portions, the tab 4 can be supported through the adhesive 5 on the tab surface portions where the grooves 20 break off. Consequently, it is possible to eliminate a limitation on the size of the chip to be mounted and therefore the lead frame becomes highly versatile.

The corner portions where the grooves 20 break off are wire-free areas, in which even if the resin component of the adhesive 5 oozes out toward the tab suspension leads 6, there arise no trouble.

In this second embodiment the pattern of the grooves 20 is not limited to the one illustrated in FIG. 19. Although in the second embodiment the grooves 20 are not formed in the corner portions, there may be adopted a construction such that some grooves 20 are extended up to predetermined corner portions, while some other grooves 20 are not extended thereto, thereby permitting the chip to be mounted stably. Further, the grooves 20 may be formed correspondingly to the wire-connected portions to prevent the occurrence of the bleeding phenomenon.

(Third Embodiment)

Figure 20:
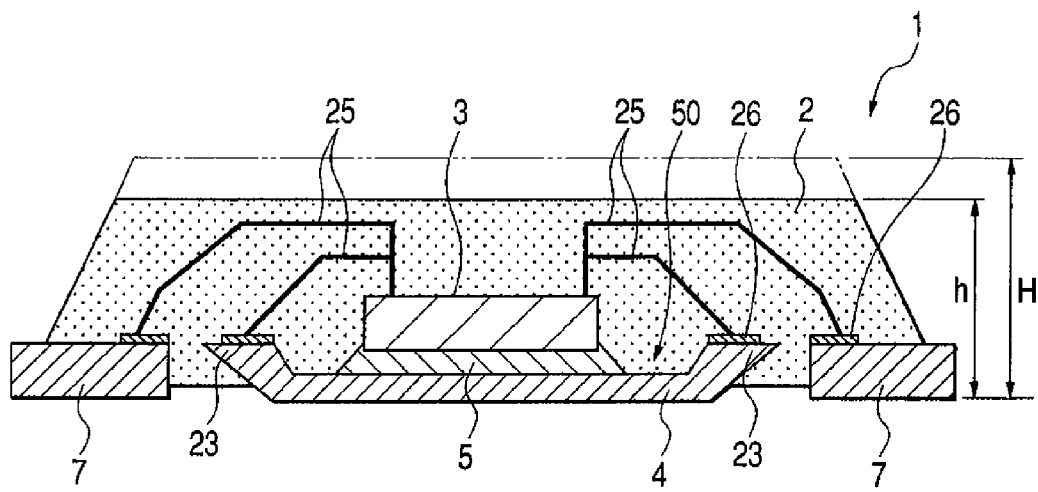
FIG. 20 is a schematic sectional view of a non-leaded type semiconductor device according to a third embodiment of the present invention.

FIG. 20 is a schematic sectional view of a non-leaded type semiconductor device according to a third embodiment of the present invention.

In the semiconductor device of this third embodiment, indicated at 1, a recess 50 having a size larger than the chip 3 mounted thereon and having a flat bottom is formed in the tab 4 except the wire connection areas positioned at the outer periphery of the tab 4. In this embodiment, the chip 3 is fixed to the flat bottom of the recess 50 with the adhesive 5, so if the depth of the recess 50 and the thickness of the adhesive 5 are suitably selected, the bottom of the chip 3 comes to enter the bottom side of the recess 50 beyond the height of the tab surface and thus it is possible to set the height, h, of the semiconductor device 1 lower than the height, H, of the semiconductor device 1 of the first embodiment.

Thus, the mounting height of the semiconductor device 1 of this third embodiment can be made low. As a result, it is possible to attain the reduction in thickness of controllers and modules of high-frequency semiconductor devices, digital cameras and disk products in which the semiconductor device 1 is incorporated.

In the case where the adhesive 5, i.e., Ag paste, is applied as thick as 20 to 30 μm, the adhesive also functions as a buffer material and exhibits an effect of relieving a stress induced by a difference in thermal expansion coefficient.

For fixing the chip 3 stably to the bottom of the recess 50, the adhesive may be substituted by a sheet (e.g., a both-side adhesive sheet) having a constant thickness.

(Fourth Embodiment)

Figure 21:
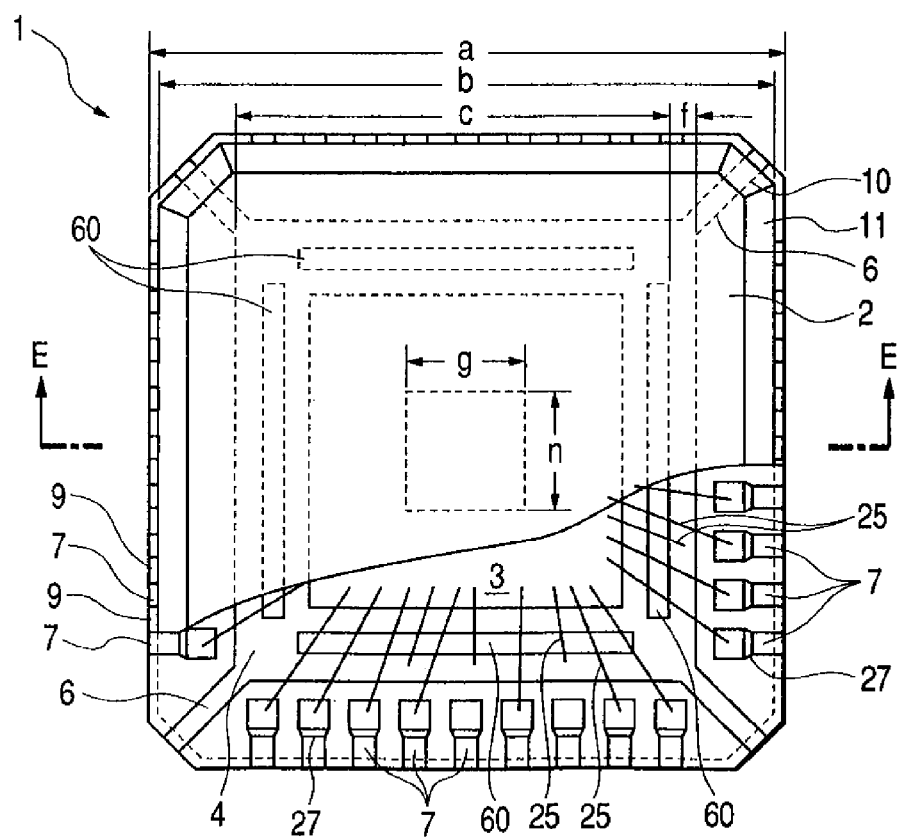
FIG. 21 is a partially cut-away plan view of a non-leaded type semiconductor device according to a fourth embodiment of the present invention.
Figure 22:
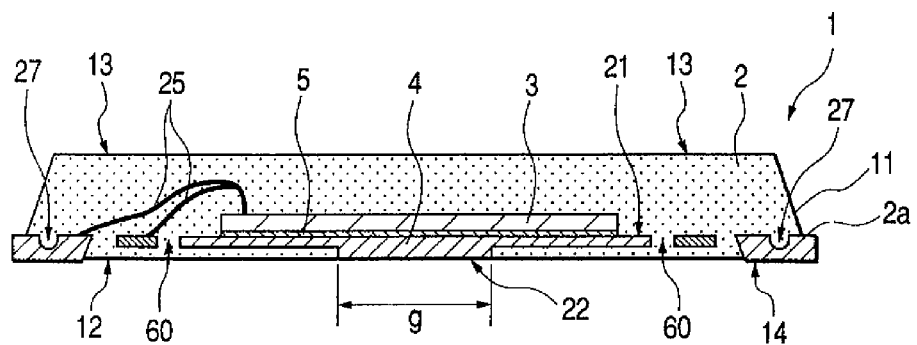
FIG. 22 is an enlarged sectional view taken along line E-E in FIG. 21.
Figure 23:
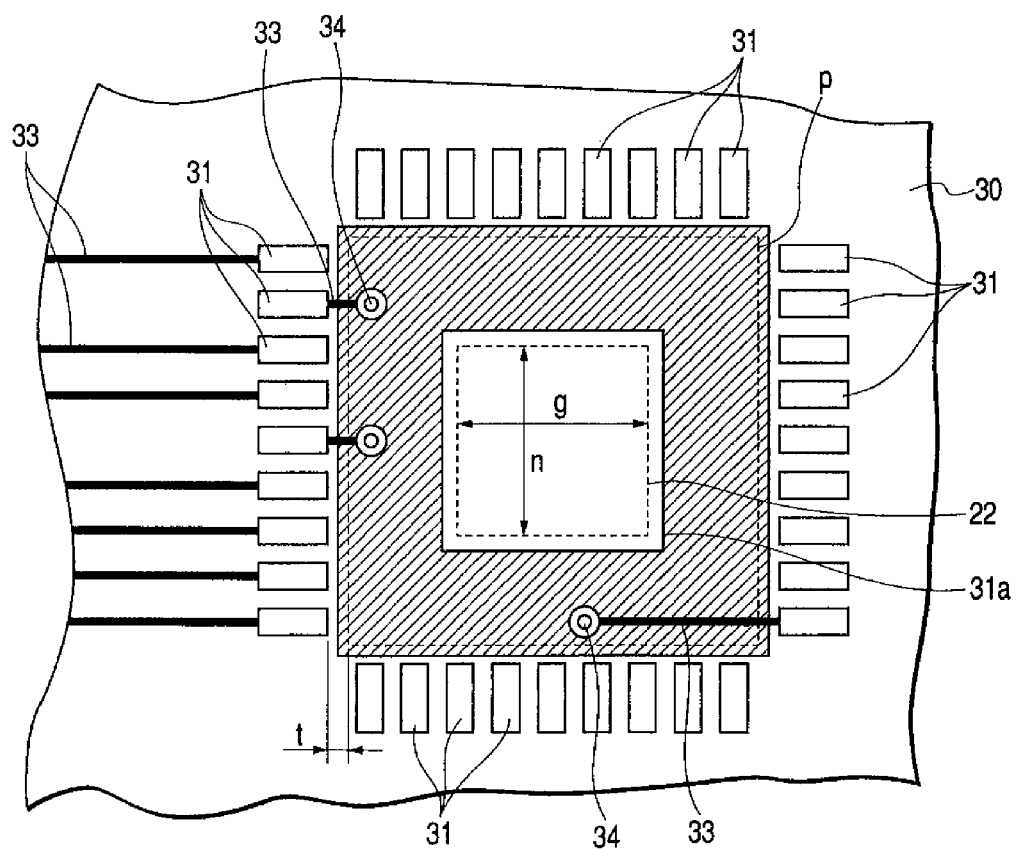
FIG. 23 is a schematic plan view showing an area occupied by a tab, etc. on a mounting substrate for the non-leaded type semiconductor device of the fourth embodiment.

FIGS. 21 to 23 illustrate a non-leaded type semiconductor device according to a fourth embodiment of the present invention, of which FIG. 21 is a partially cut-away plan view of the semiconductor device and FIG. 22 is an enlarged sectional view taken on line E-E in FIG. 21.

In the semiconductor device of this fourth embodiment, indicated at 1, the groove 20 used in the semiconductor device 1 of the first embodiment is substituted by slits 60 which pierce the tab 4.

Since the slits 60 are through holes, it is impossible to arrange the slits 60 so as to surround the whole circumference of the semiconductor chip (semiconductor element fixing area). If the slits 60 are so arranged, the semiconductor element fixing area can no longer be supported. In this fourth embodiment, therefore, straight slits 60 extending respectively along the sides of the square semiconductor fixing area (semiconductor chip 3) are formed each independently.

Peripheral portions of the back side 22 of the tab 4 are subjected to half etching or coining and are thereby stepped thin, and the back side 22 of the tab is partially exposed from the package 2. More specifically, as shown in FIGS. 21 and 22, only a central portion of the tab 4 is exposed to the back side 12 of the package 2, while the portion which surrounds the central portion is buried within the package 2. The aforesaid exposed portion has a length of g and a width of n. Of course, this size can be set freely. The slits 60 are formed in the thin portion of the tab 4.

The other portions, e.g., plating film, than those just referred to above are the same as in the semiconductor device 1 of the first embodiment and also as to the manufacturing method for the semiconductor device of this fourth embodiment, it is the same as that described in the first embodiment.

With reference to FIG. 21, an example of dimensions of the semiconductor device 1 according to this fourth embodiment will now be shown, though the example is not meant to limit other examples. In the semiconductor device 1, when seen in plan, the package 2 and the tab 4 are square in shape. The length, a, from the tips of leads 7 on one side to the tips of leads 7 on the opposite side is 6.20 mm, an external size, b, of the package 2 is 6.00 mm, the length, c, of one side of the tab 4 is 4.60 mm, the length of each slit 60 is 3.40 mm, the width of each slit 60 is 0.20 mm, which is the same as the width of each tab suspension lead 6, and the distance, f, from an outer edge of each slit 60 to an edge of the tab 4 is 0.30 mm.

In the semiconductor device 1 of this fourth embodiment the groove 20 formed between the semiconductor element fixing area and the wire connection areas in the semiconductor device 1 of the first embodiment 1 is substituted by the slits 60 piercing the tab 4. Therefore, the same effects based on the same function as in the provision of the groove 20 can be attained.

More particularly, according to this fourth embodiment, (a) the length of down bonding wires can be made short and therefore in a high-frequency device it is possible to stabilize the ground potential of circuit.

(b) With the slits 60, it is possible to prevent stain caused by the adhesive 5 in the wire connection areas and hence possible to enhance the connection reliability in down bonding.

(c) With the slits 60, the bleeding length of the resin component of the adhesive 5 can be reduced, so that the peeling-off between the tab 4 and the resin can be made difficult to occur and it is possible to improve the moisture resistance of the package 2.

(d) Since the area of the tab surface is larger than that of the back side of the tab 4, the tab 4 bites into the resin and becomes difficult to peel off from the package 2.

(e) Since there is no lug on the tab surface, a wire loop can be made low and small and it is possible to attain the reduction in thickness and size of the package 2.

(f) Since the leads 7 are formed with grooves 27 respectively, the leads 7 become difficult to peel off from the resin and it is possible to make long the path of water entry along the leads 7, so that it is possible to prevent water-corrosion of the wires 25 connected to the leads 7.

(g) Since the wires 25 are fixed onto Ag plating film, it is possible to improve the connection strength of the wires 25.

(h) Since it is possible to prevent peeling-off of wire connections and peeling-off between the tab 4 and the resin, it is possible to improve the manufacturing yield of the semiconductor device and reduce the manufacturing cost.

Moreover, in the semiconductor device 1 of this fourth embodiment, since the slits 60 are formed between the semiconductor fixing area and the wire connection areas, both end portions of the wire connection areas extending along each side of the tab 4 are supported by the tab portion deviated from slit ends. Therefore, in the event there occurs a thermal stress (thermal strain) caused by a difference in thermal expansion coefficient between the package 2 constructed of resin in directions orthogonal to the slits 60 and the tab 4 constructed of metal, the wire connection areas extending along the slits 60 can move together with the resin in directions orthogonal to the slits 60, so that the wires 25 become difficult to peel off from the wire connection areas of the tab 4 and the reliability of wire bonding becomes high.

Further, in the semiconductor device 1 of this fourth embodiment, the slits 60 piercing the tab 4 are formed between the semiconductor element fixing area and the wire connection areas, the tab portion with the slits 60 formed therein being is formed thin, and this thin portion is positioned in the interior of the package 2. Therefore, the tab portion having the wire connection areas positioned outside the slits 60 is surrounded throughout the whole circumference including upper, lower and right, left sides with the resin which constitutes the package 2, resulting in that the resin-tab bonding force becomes large and the tab 4 becomes difficult to peel off from the package 2.

Further, in the semiconductor device 1 of this fourth embodiment, the tab 4 is machined to provide a portion where the back side of the tab is exposed to the back side 12 of the package 2 and a portion buried into the package 2. Consequently, it becomes possible to design wiring at a portion of a mounting substrate corresponding to the buried portion of the tab in the package 2.

More specifically, FIG. 23 is a schematic plan view showing an occupied area of the tab, etc., on a mounting substrate for the non-leaded type semiconductor device of this fourth embodiment. As shown in the same figure, lands 31 are arranged in a semiconductor device fixing area of a mounting substrate 30 correspondingly to mounting surfaces 14 of the leads 7 exposed to the back side of the package 2 in the semiconductor device 1. The lands 31 are arranged along the sides of a square shape and therefore the area inside the lands is a square area. Centrally of the square area is provided a land 31a which is connected to the back side 22 of the tab 4. The land 31a is connected firmly to the back side 22 with use of an electrically conductive bonding material 32 and to this end the land 31a is slightly larger than the size (length, g, width, n) of tab back side 22. The size of the tab back side 22 can be selected freely on condition that a size (t) for preventing short-circuit between the land 31a and the lands 31 should be ensured. The hatched square area in FIG. 23 is of a size for maximum exposure of the back side 22 of the tab 4, corresponding to the maximum size of the land 31a.

Therefore, given that the length and width of the back side 22 of the tab 4 are g and n, respectively, the hatched square frame area, p, in FIG. 23 corresponds to an area occupied by the back side 12 of the package 2 which is formed of an insulating resin. Consequently, wiring lines 33 and through holes 34 can be disposed in the square frame area, p, of the mounting substrate 30 and thus the freedom of wiring layout design on the mounting substrate 30 becomes high.

Figure 24:
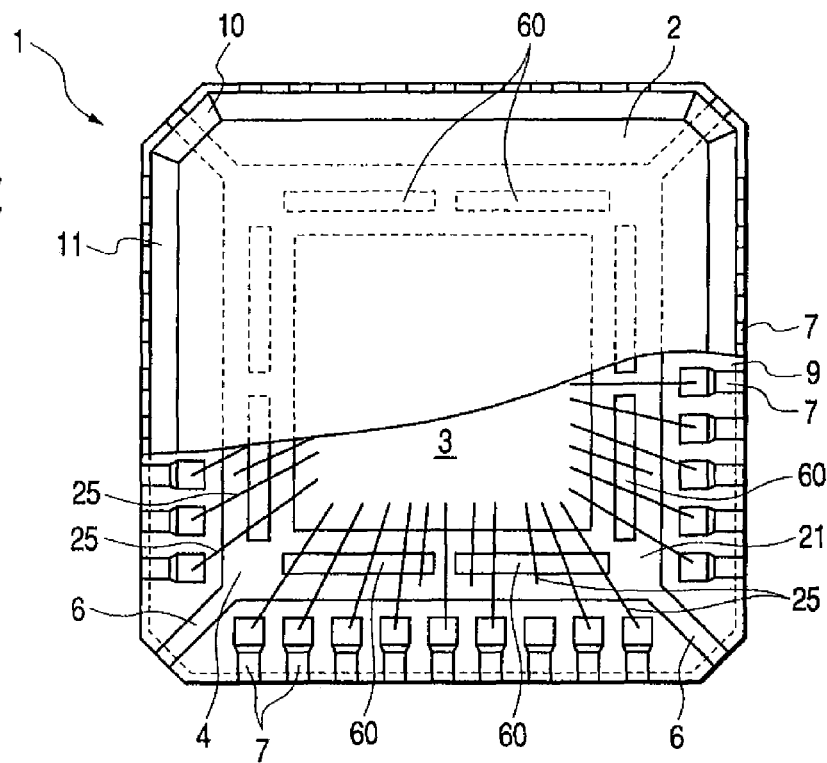
FIG. 24 is a partially cut-away plan view of a non-leaded type semiconductor device according to a modification of the fourth embodiment.

FIG. 24 is a partially cut-away plan view of a non-leaded type semiconductor device according to a modification of the fourth embodiment. In this modification, plural slits 60 are arranged intermittently in a line between the semiconductor element fixing area and wire connection areas located along the sides of the tab 4. To be more specific, in this modification, two slits 60 are arranged intermittently in a line. Such an intermittent arrangement of slits 60 is advantageous in that the rigidity of the wire connection areas located along each side of the tab 4 is enhanced in a direction orthogonal to the slits 60 as compared with the case of a single long slit such as that in the fourth embodiment.

(Fifth Embodiment)

Figure 25:
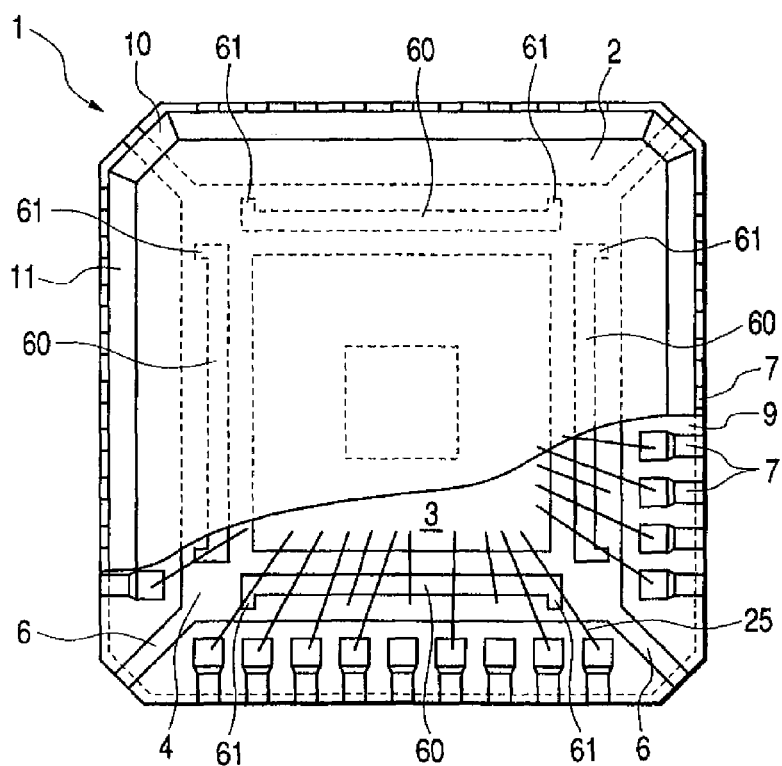
FIG. 25 is a partially cut-away plan view of a non-leaded type semiconductor device according to a fifth embodiment of the present invention.

FIG. 25 is a partially cut-away plan view of a non-leaded type semiconductor device according to a fifth embodiment of the present invention. In the semiconductor device of this fifth embodiment, indicated at 1, slits 61 are formed in both end portions of each slit 60 so as to extend from the slit 60 toward the outer periphery of the tab 4. The slit 61 pierces the tab 4. If the tip of each slit 61 reaches an edge of the tab 4, the wire connection areas are no longer supported, and therefore the tip of each slit 61 does not reach tab edge.

According to this structure, in the wire connection areas located along the sides of the tab 4, a thermal strain induced by a difference in thermal expansion coefficient between the tab 4 and the resin (package 2) is cut off by the slits 61 and the wires 25 connected to the wire connection areas become movable together with resin present between the slits 61, so that the wires 25 become difficult to peel off from the wire connection areas. The slits 61 relieves thermal stresses in the extending directions of the slits 60 and exhibit an effect similar to the thermal strain relaxing effect in the directions orthogonal to the slits 60 though the effect is lower than that based on the slits 60.

Figure 26:
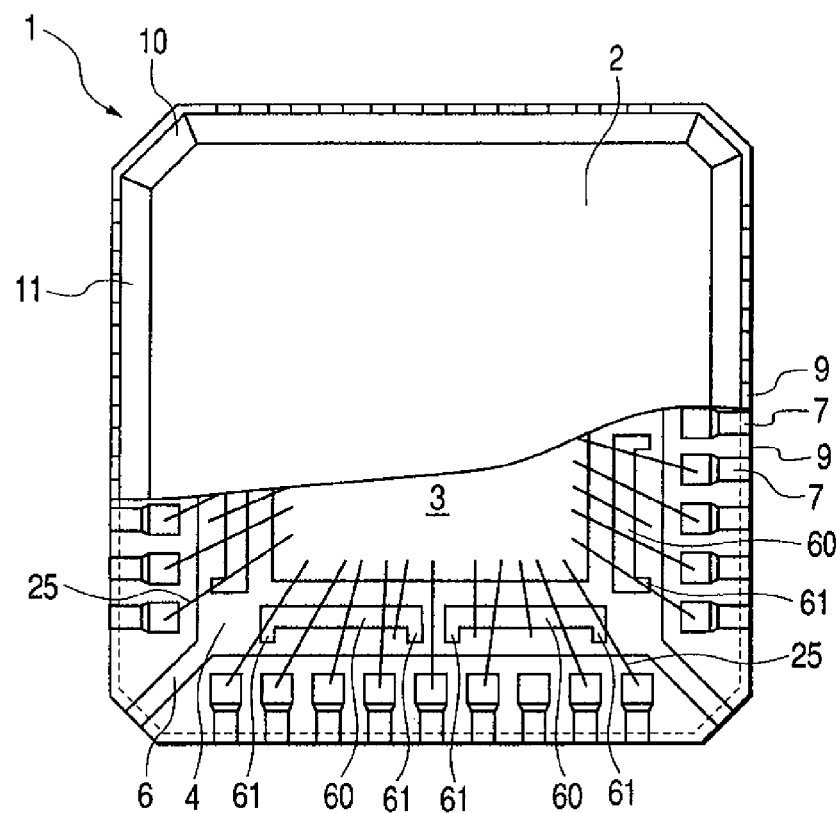
FIG. 26 is a partially cut-away plan view of a non-leaded type semiconductor device according to a modification of the fifth embodiment.

FIG. 26 is a partially cut-away plan view showing a non-leaded type semiconductor device according to a modification of the fifth embodiment. In this modification, plural (two) slits 60 are arranged in a line along each side of the tab 4 and the foregoing slits 61 are formed at both ends of each slit 60. According to this modification, since plural slits 61 are arranged along each side of the tab 4, the aforesaid thermal strain relieving effect is further enhanced.

In the fifth embodiment, the wire connection areas are partially surrounded with the slits 60 and the slits 61 extending from the slits 60. According to this construction, it is also possible to expect the effect of preventing the adhesive 5 (paste material) from detouring the tab surface portions located outside both ends of each straight slit 60 and flowing into the wire connection areas, which adhesive 5 is for fixing the semiconductor chip 3 to the tab 4. As a result, the bonding performance of the wires 25 connected to the wire connection areas is improved and the reliability of the semiconductor device 1 becomes high.

For attaining the foregoing thermal strain relieving effect, one or plural slits may be formed inwards from the outer peripheral edges of the tab 4.

(Sixth Embodiment)

Figure 27:
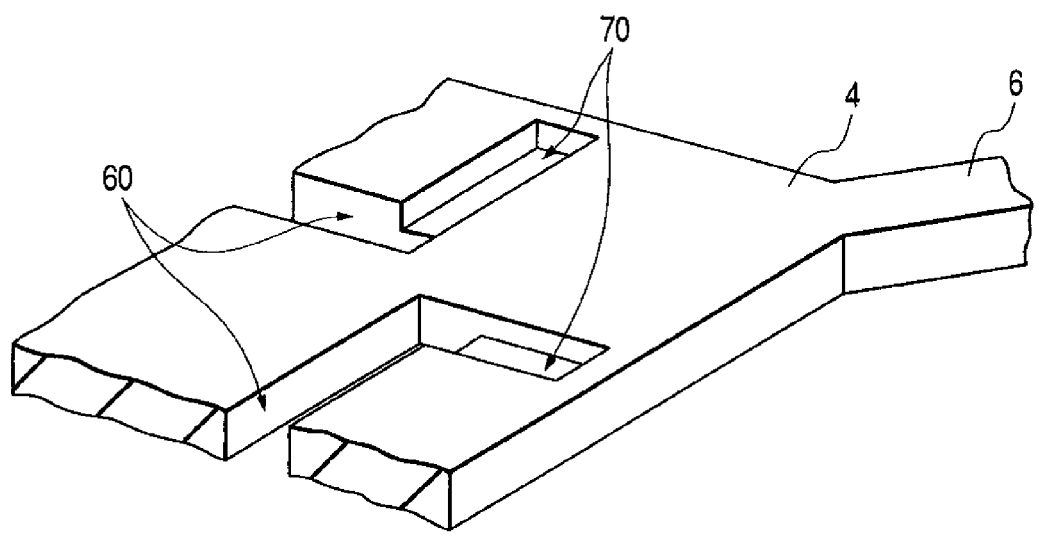
FIG. 27 is a perspective view showing a part of a tab used in a non-leaded type semiconductor device according to a sixth embodiment of the present invention.

FIG. 27 is a perspective view showing a part of a tab used in a non-leaded type semiconductor device according to a sixth embodiment of the present invention. In this sixth embodiment, bottomed grooves 70 are formed, instead of the foregoing slits 61, at both ends of each slit 60 formed between the semiconductor element fixing area and the wire connection areas which are located along the sides of the tab 4. More specifically, one or plural slits 70 are formed at both ends of each slit 60 so as to extend toward the outer periphery of the tab 4.

The grooves 70 used in this embodiment have bottoms, so unlike the slits, even if the grooves reach the edges of the tab 4, there arises no problem because the wire connection areas can be supported.

Also in this sixth embodiment the effects obtained are less outstanding than in the case of slits piercing the tab 4, but when viewed microscopically, in the surface layer portion of the tab 4, especially in the wire connection areas located along the sides of the tab 4, a thermal strain induced by a difference in thermal expansion coefficient between the tab and the resin (package 2) is cut off by the presence of the grooves 70, so that the wires 25 connected to the wire connection areas become movable together with the resin present between the grooves 70 and the wires 25 become difficult to peel off from the wire connection areas.

In this sixth embodiment, the wire connection areas are partially surrounded with the slits 60 and the grooves 70 extending from the slits 60. According to this construction, therefore, it is also possible to expect the effect of preventing the adhesive 5 (paste material) from detouring the tab surface portions located outside both ends of each straight slit 60 and flowing into the wire connection areas, which adhesive 5 is for fixing the semiconductor chip 3 to the tab 4. As a result, the bonding performance of the wires 25 connected to the wire connection areas is improved and the reliability of the semiconductor device 1 becomes high. As noted earlier, even if the grooves 70 extending from each slit 60 are allowed to reach an edge of the tab 4, there can be obtained the same effects as in the structure shown in FIG. 27.

For attaining the foregoing thermal strain relieving effect, one or plural grooves may be formed inwards from each outer peripheral edge of the tab 4.

Although the present invention has been described above concretely by way of embodiments thereof, it goes without saying that the invention is not limited to the above embodiments, but that various changes may be made within the scope not departing from the gist of the invention.

Although in the above embodiments the present invention has been applied to the manufacture of a QFN type semiconductor device, the invention is also applicable equally, for example, to the manufacture of an SON semiconductor device and there can be obtained the same effects as above. Further, the present invention is not limited to a non-leaded type semiconductor device but may also be applied equally to other types of semiconductor devices and there can be obtained the same effects as above.

Effects obtained by typical inventions out of those disclosed herein will be described below briefly. The present invention is not limited to the construction which attains all of the following effects, but also covers constructions which attains part of the effects.

(1) It is possible to provide a semiconductor device and a non-leaded type semiconductor device both high in the reliability of wire connection.

(2) It is possible to provide a semiconductor device and a non-leaded type semiconductor device both high in the reliability of down-bonded portions.

(3) It is possible to provide a semiconductor device and a non-leaded type semiconductor device both high in close adherence between the tab with a semiconductor element mounted thereon and resin which constitutes a package.

(4) It is possible to provide a semiconductor device and a non-leaded type semiconductor device which are capable of preventing peeling-off between a tab surface and a package-constituting resin.

(5) By providing a semiconductor device structure wherein a central portion of a tab is exposed from a package and the surrounding portion of the tab is positioned within the package, the freedom of wiring design in a mounting substrate for mounting the semiconductor device is improved.

What is claimed is:

1. A semiconductor device comprising:
    a semiconductor chip having an obverse surface over which a plurality of electrodes are formed and a reverse surface opposite the obverse surface;
    a first metal component having a first surface including a chip mounting portion over which the semiconductor chip is mounted and a wire connecting portion;
    a plurality of second metal components arranged to surround the first metal component;
    a plurality of first wires electrically connected to the plurality of second metal components and a plurality of first electrodes of the semiconductor chip, respectively;
    a second wire electrically connected to the wire connecting portion of the first metal component and a second electrode of the semiconductor chip; and
    a sealing body having a top surface and a bottom surface opposite the top surface and sealing the semiconductor chip, the first surface of the first metal component, a part of each of the plurality of second metal components, the plurality of first wires, and the second wire,
    wherein, in a cross-section view of the first metal component and in a first direction perpendicular to a second direction which is a thickness direction of the first metal component, a width of the chip mounting portion of the first metal component is greater than a width of the reverse surface of the semiconductor chip,
    wherein, in the cross-section view and in the first direction, the wire connecting portion is located outside of the chip mounting portion,
    wherein, in the cross-section view and in the second direction, a height of a connecting part to which the second wire is connected of the wire connecting portion is higher than a height of a mounting part on which the semiconductor chip is mounted of the chip mounting portion,
    wherein, in the cross-section view and in the second direction, a height of the reverse surface of the semiconductor chip is lower than the height of the connecting part of the wire connecting portion,
    wherein, in the cross-section view and in the second direction, the height of the connecting part of the wire connecting portion is located between a height of the obverse surface and a height of the reverse surface of the semiconductor chip,
    wherein the first metal component has an exposed portion from the bottom surface of the sealing body,
    wherein, in the cross-section view and in the first direction, a width of the exposed portion becomes narrow as the distance from the bottom surface of the sealing body increases, and
    wherein, in the cross-section view and in the first direction, a width of the narrowest part of the exposed portion is greater than the width of the reverse surface of the semiconductor chip.

2. The semiconductor device according to claim 1,
    wherein, in the cross-section view and in the second direction, the height of the connecting part of the wire connecting portion is lower than a height of a connecting part of the second wire and the second electrode of the semiconductor chip.

3. The semiconductor device according to claim 1,
    wherein, in the cross-section view and in the second direction, a height of each of connecting parts of the plurality of first wires and the plurality of second metal components is lower than a height of each connecting parts of the plurality of first wires and the plurality of first electrodes of the semiconductor chip.

4. The semiconductor device according to claim 1,
    wherein the exposed portion of the first metal component is a portion which can be supplied a ground potential from outside.

5. The semiconductor device according to claim 1,
    wherein each of surfaces opposite surfaces to which the plurality of first wires are electrically connected of the plurality of second metal components is exposed from the bottom surface of the sealing body.

6. The semiconductor device according to claim 1,
    wherein the exposed portion of the first metal component has a second surface opposite the first surface,
    wherein the second surface is a bottom surface of the first metal component, and
    wherein the second surface can be soldered.

7. The semiconductor device according to claim 1,
    wherein each of the plurality of second metal components has a surface exposed from the bottom surface of the sealing body and the surface can be soldered.

8. The semiconductor device according to claim 1, wherein, in a plan view from the first surface of the first metal component, a plane area of the chip mounting portion is greater than a plane area of the semiconductor chip.

9. The semiconductor device according to claim 1, wherein, in a plan view from the first surface of the first metal component, a plane area of the narrowest part of the exposed portion of the first metal component is greater than a plane area of the semiconductor chip.

10. The semiconductor device according to claim 1, wherein a first plating film is formed on each of parts to which the plurality of first wires are electrically connected of the plurality of second metal components.

11. The semiconductor device according to claim 10, wherein the first plating film is composed of Ag plating film.

12. The semiconductor device according to claim 1, wherein a second plating film is formed on a part to which the second wire is electrically connected of the wire connecting portion of the first metal component.

13. The semiconductor device according to claim 12, wherein the second plating film is composed of Ag plating film.

14. The semiconductor device according to claim 1, wherein each of the first metal component and the plurality of second metal components is composed of Cu.

15. The semiconductor device according to claim 14, wherein the first metal component is a tab and the plurality of second metal components are a plurality of leads.

16. The semiconductor device according to claim 1, wherein the semiconductor chip is fixed over the chip mounting portion of the first metal component via an adhesive.

17. The semiconductor device according to claim 16, wherein the adhesive is Ag paste.

18. A semiconductor device comprising:
a semiconductor chip having an obverse surface over which a plurality of electrodes are formed and a reverse surface opposite the obverse surface;
a first metal component having a first surface and a second surface opposite the first surface, the first surface including a chip mounting portion over which the semiconductor chip is mounted and a wire connecting portion;
a plurality of second metal components arranged to surround the first metal component;
a plurality of first wires electrically connected to the plurality of second metal components and a plurality of first electrodes of the semiconductor chip, respectively;
a second wire electrically connected to the wire connecting portion of the first metal component and a second electrode of the semiconductor chip; and
a sealing body having a top surface and a bottom surface opposite the top surface and sealing the semiconductor chip, the first surface of the first metal component, a part of each of the plurality of second metal components, the plurality of first wires, and the second wire,
wherein, in a cross-section view of the first metal component and in a first direction perpendicular to a second direction which is a thickness direction of the first metal component, a width of the chip mounting portion of the first metal component is greater than a width of the reverse surface of the semiconductor chip,
wherein, in the cross-section view and in the first direction, the wire connection portion is located outside of the chip mounting portion,
wherein, in the cross-section view and in the second direction, a height of a connecting part to which the second wire is connected of the wire connecting portion is higher than a height of a mounting part on which the semiconductor chip is mounted of the chip mounting portion,
wherein, in the cross-section view and in the second direction, a height of the reverse surface of the semiconductor chip is lower than the height of the connecting part of the wire connecting portion,
wherein, in the cross-section view and in the second direction, the height of the connecting part of the wire connection portion is located between a height of the obverse surface and a height of the reverse surface of the semiconductor chip,
wherein the first metal component has an exposed portion which includes the second surface from the bottom surface of the sealing body,
wherein the second surface is a bottom surface of the first metal component,
wherein, in the cross-section view and in the first direction, a width of the second surface is narrower than the width of any other part of the exposed portion, and
wherein, in the cross-section view and in the first direction, the width of the second surface is greater than the width of the reverse surface of the semiconductor chip.

19. The semiconductor device according to claim 18, wherein the second surface can be soldered.

20. The semiconductor device according to claim 18, wherein each of the plurality of second metal components has a surface exposed from the bottom surface of the sealing body and the surface can be soldered.

21. The semiconductor device according to claim 18, wherein, in the cross-section view and in the second direction, the height of the connecting part of the second wire and the wire connecting portion is lower than a height of a connecting part of the second wire and the second electrode of the semiconductor chip.

22. The semiconductor device according to claim 18, wherein, in the cross-section view and in the second direction, a height of each of connecting parts of the plurality of first wires and the plurality of second metal components is lower than a height of each connecting parts of the plurality of first wires and the plurality of first electrodes of the semiconductor chip.

23. The semiconductor device according to claim 18, wherein the exposed portion of the first metal component is a portion which can be supplied a ground potential from outside.

24. The semiconductor device according to claim 18, wherein each of surfaces opposite surfaces to which the plurality of first wires are electrically connected of the plurality of second metal components is exposed from the bottom surface of the sealing body.

25. The semiconductor device according to claim 18, wherein, in a plan view from the first surface of the first metal component, a plane area of the chip mounting portion is greater than a plane area of the semiconductor chip.

26. The semiconductor device according to claim 18, wherein, in a plan view from the first surface of the first metal component, a plane area of the second surface of the first metal component is greater than a plane area of the semiconductor chip.

27. The semiconductor device according to claim 18, wherein a first plating film is formed on each of parts to which the plurality of first wires are electrically connected of the plurality of second metal components.

28. The semiconductor device according to claim 27, wherein the first plating film is composed of Ag plating film.

29. The semiconductor device according to claim 18, wherein a second plating film is formed on a part to which the second wire is electrically connected of the wire connecting portion of the first metal component.

30. The semiconductor device according to claim 29, wherein the second plating film is composed of Ag plating film.

31. The semiconductor device according to claim 18, wherein each of the first metal component and the plurality of the second metal components is composed of Cu.

32. The semiconductor device according to claim 31, wherein the first metal component is a tab and the plurality of second metal components are a plurality of leads.

33. The semiconductor device according to claim 18, wherein the semiconductor chip is fixed over the chip mounting portion of the first metal component via an adhesive.

34. The semiconductor device according to claim 33, wherein the adhesive is Ag paste.

* * * * *